(12) United States Patent
Popovich

(10) Patent No.: US 7,105,858 B2
(45) Date of Patent: Sep. 12, 2006

(54) ELECTRONIC ASSEMBLY/SYSTEM WITH REDUCED COST, MASS, AND VOLUME AND INCREASED EFFICIENCY AND POWER DENSITY

(75) Inventor: John M. Popovich, Solana Beach, CA (US)

(73) Assignee: OnScreen Technologies, Safety Harbor, FL (US)

( * ) Notice: Subject to any disclaimer, the term of this patent is extended or adjusted under 35 U.S.C. 154(b) by 0 days.

(21) Appl. No.: 10/625,185

(22) Filed: Jul. 23, 2003

(65) Prior Publication Data

US 2004/0125515 A1 Jul. 1, 2004

Related U.S. Application Data

(60) Provisional application No. 60/405,826, filed on Aug. 26, 2002.

(51) Int. Cl.
- H01L 29/18 (2006.01)
- H01L 23/52 (2006.01)
- H01L 23/02 (2006.01)
- H01L 23/34 (2006.01)
- H01L 33/00 (2006.01)

(52) U.S. Cl. ............... 257/88; 257/89; 257/91; 257/98; 257/99; 257/680; 257/691; 257/693; 257/698; 257/713; 257/714; 257/717; 257/718; 257/719; 257/721; 257/724; 257/726; 257/773; 257/776; 257/784; 257/E51.018; 257/E51.019; 257/E51.021; 257/E51.022; 257/E33.056; 257/E33.057; 257/E33.058; 257/E33.062; 257/E33.065; 257/E33.066; 257/E33.067; 257/E33.068; 257/E33.07; 257/E33.075; 257/910

(58) Field of Classification Search ............... None
See application file for complete search history.

(56) References Cited

U.S. PATENT DOCUMENTS

| | | | | |
|---|---|---|---|---|
| 4,241,277 A * | 12/1980 | Hintze et al. | ............... | 313/500 |
| 4,394,600 A * | 7/1983 | Flannagan | ............... | 313/500 |
| 4,937,654 A * | 6/1990 | Hirabayashi | ............... | 257/668 |
| 5,059,373 A * | 10/1991 | Hirabayashi | ............... | 264/154 |
| 5,471,371 A | 11/1995 | Koppolu et al. | | |
| 5,478,778 A * | 12/1995 | Tanisawa | ............... | 438/25 |
| 5,550,721 A * | 8/1996 | Rapisarda | ............... | 362/205 |
| 5,632,551 A | 5/1997 | Roney et al. | | |
| 5,719,444 A * | 2/1998 | Tilton et al. | ............... | 257/714 |
| 5,746,497 A | 5/1998 | Machida | | |
| 6,116,759 A | 9/2000 | Smith | | |
| 6,175,342 B1 | 1/2001 | Nicholson et al. | | |
| 6,238,056 B1 * | 5/2001 | Rapisarda | ............... | 362/103 |
| 6,283,613 B1 | 9/2001 | Schaffer | | |
| 6,390,643 B1 | 5/2002 | Knight | | |
| 6,402,347 B1 | 6/2002 | Maas et al. | | |
| 6,652,127 B1 | 11/2003 | Tarabula | | |
| 6,831,305 B1 * | 12/2004 | Yasukawa et al. | ............... | 257/99 |
| 2002/0074557 A1 * | 6/2002 | Uda et al. | ............... | 257/88 |

(Continued)

FOREIGN PATENT DOCUMENTS

EP 377352 A1 * 7/1990

(Continued)

Primary Examiner—David E. Graybill
(74) Attorney, Agent, or Firm—William W. Haefliger

(57) ABSTRACT

An LED display assembly, comprising a grid of electrical conductors; light emitting diodes in association with the grid and in electrical communication with the conductors that provide power for LED operation, the grid operable to receive heat from the diodes during diode operation, and the array configured for passing coolant fluid for transfer of heat to the fluid. LED packages adjustable relative to a mounting grid, are also provided.

57 Claims, 28 Drawing Sheets

U.S. PATENT DOCUMENTS

| | | |
|---|---|---|
| 2003/0048912 A1* | 3/2003 | Reich .................. 381/124 |
| 2003/0063463 A1 | 4/2003 | Sloan et al. |
| 2003/0098460 A1* | 5/2003 | Yasukawa et al. ........... 257/99 |
| 2003/0112627 A1 | 6/2003 | Deese |

FOREIGN PATENT DOCUMENTS

| | | | |
|---|---|---|---|
| JP | 57095682 A | * | 6/1982 |
| JP | 04290478 A | * | 10/1992 |
| JP | 05072978 A | * | 3/1993 |
| JP | 05074975 A | * | 3/1993 |
| JP | 05134615 A | * | 5/1993 |
| JP | 06151915 A | * | 5/1994 |
| JP | 06314863 A | * | 11/1994 |
| JP | 2003223121 A | * | 8/2003 |

* cited by examiner

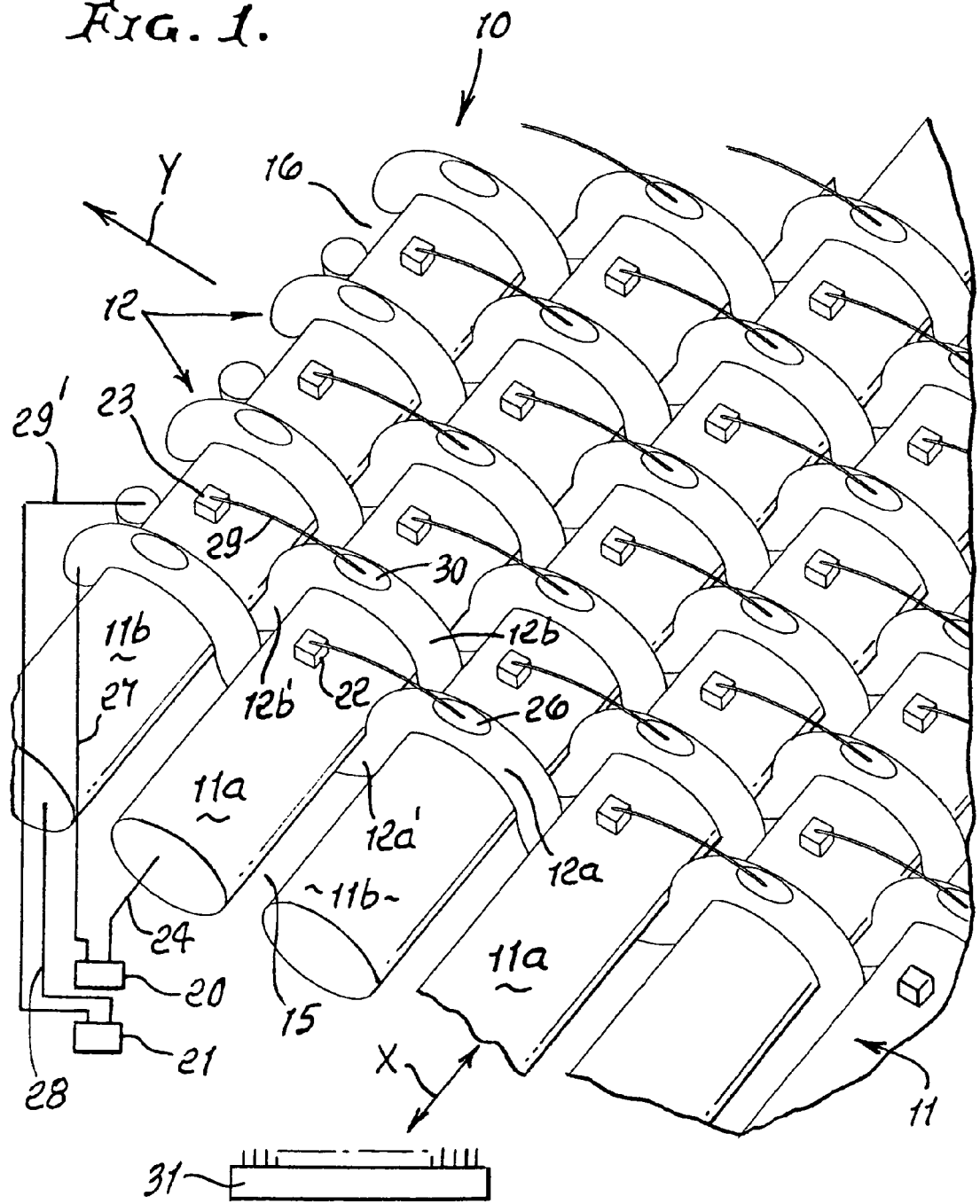

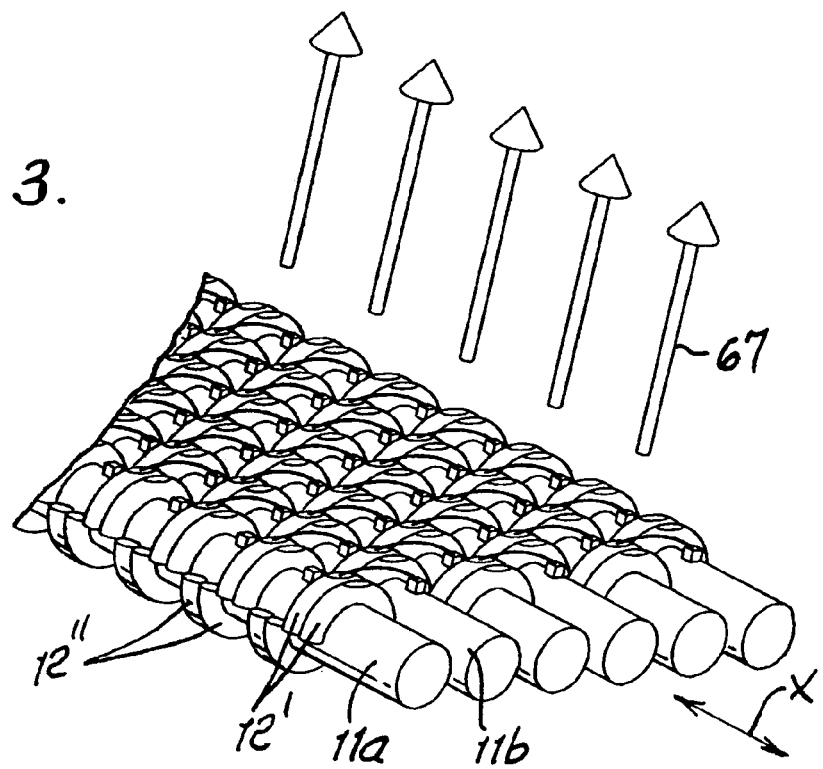
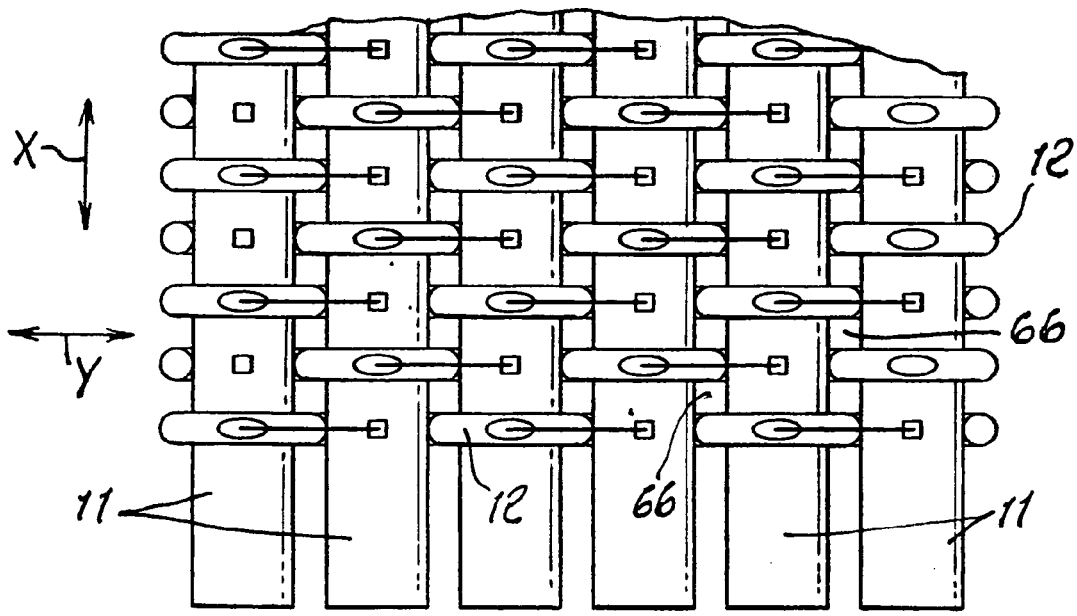

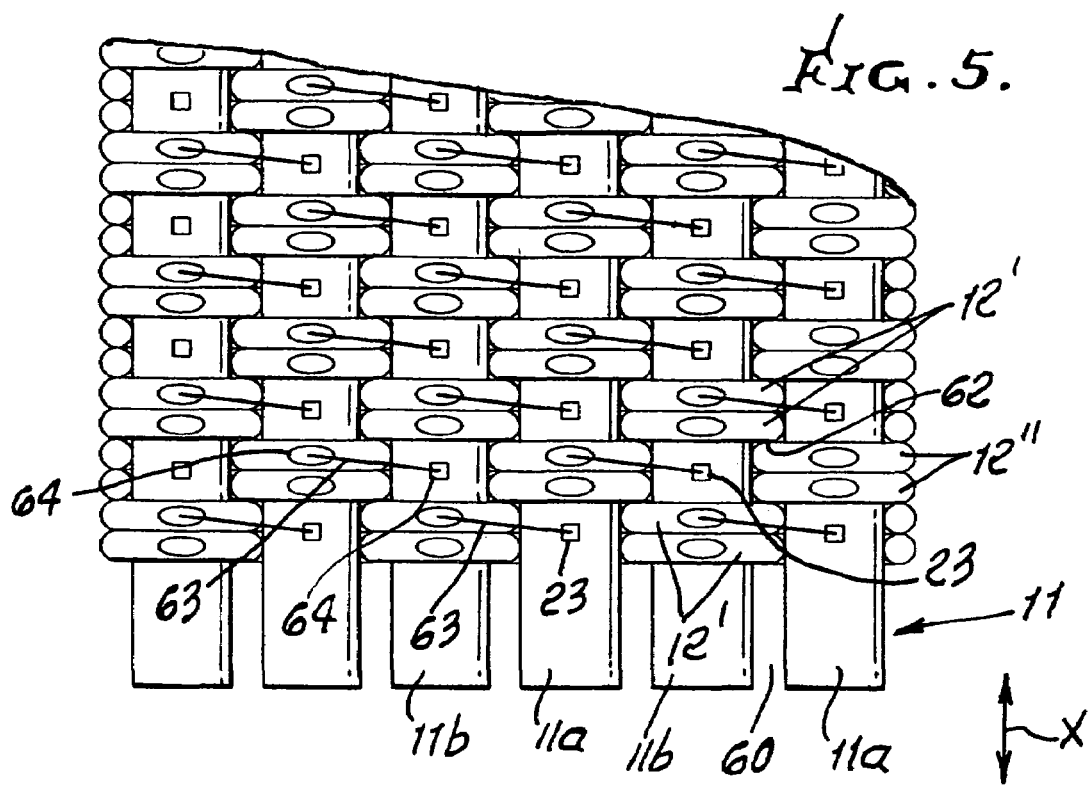
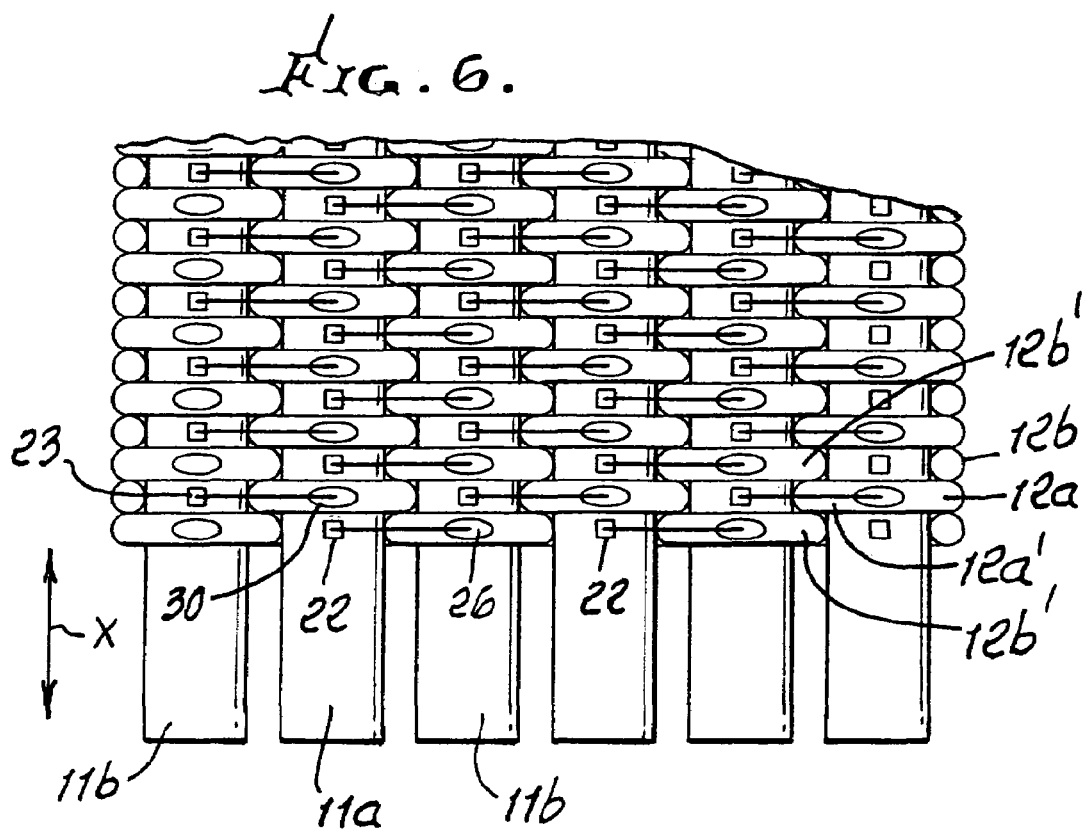

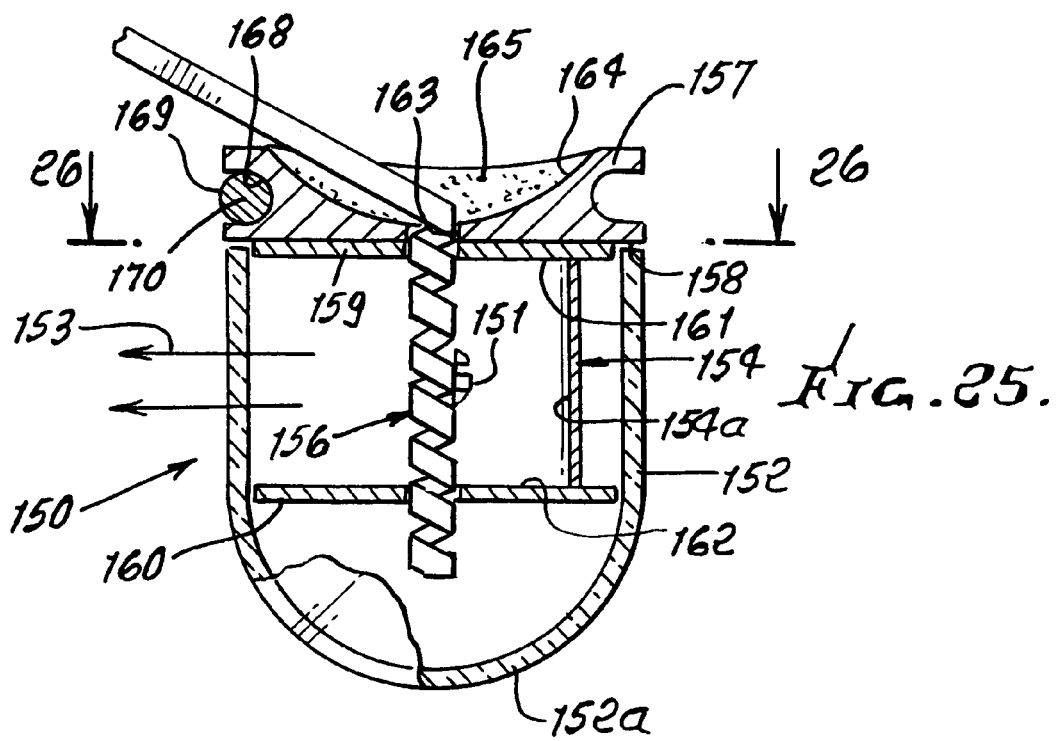
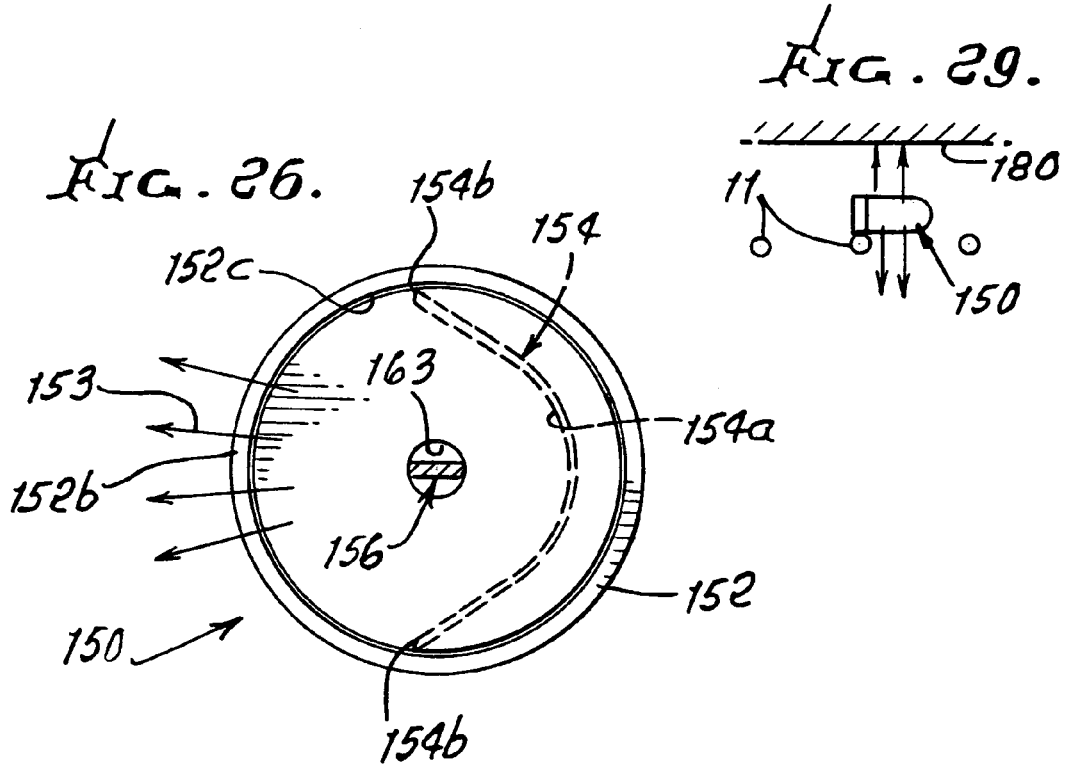

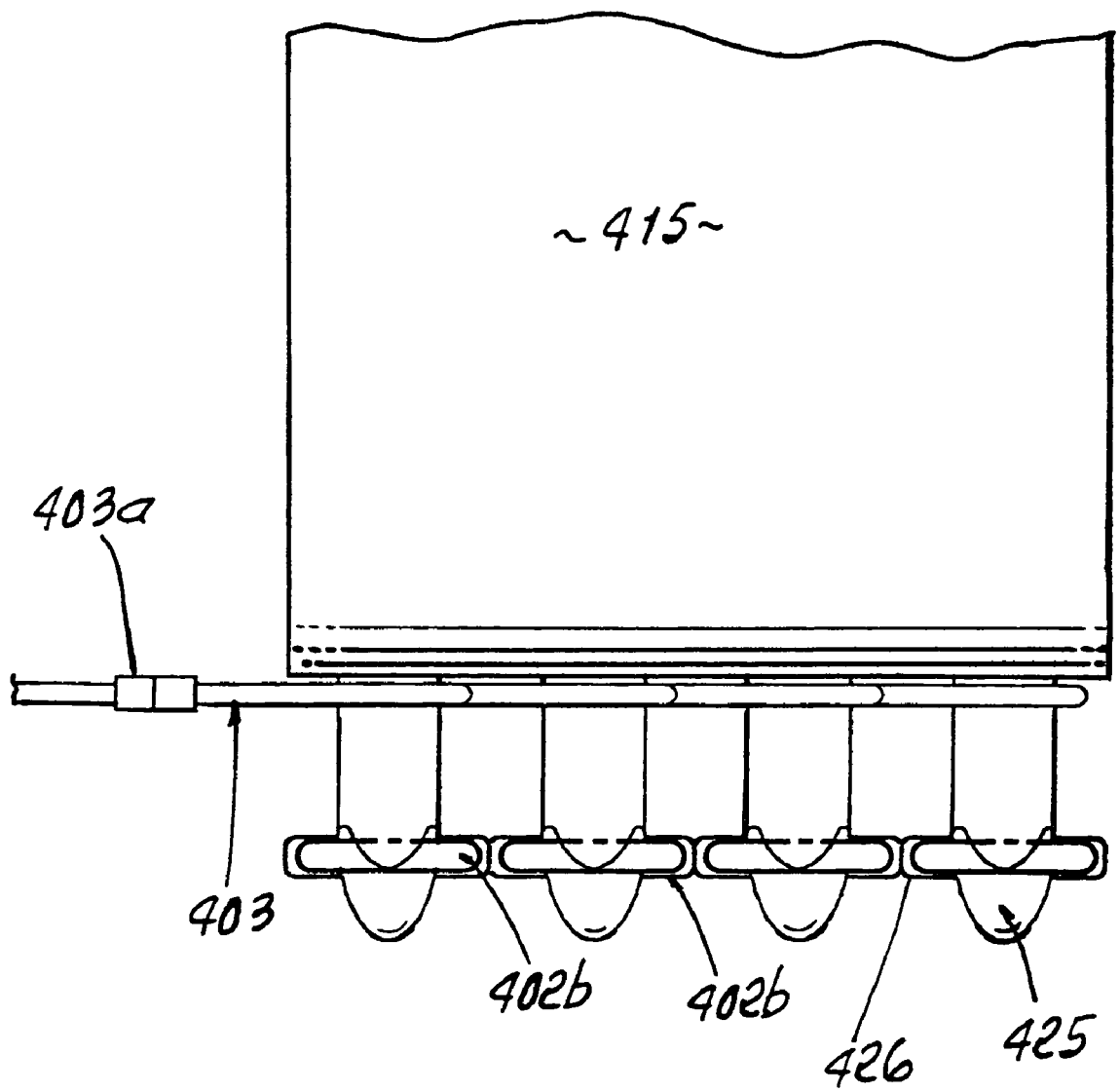

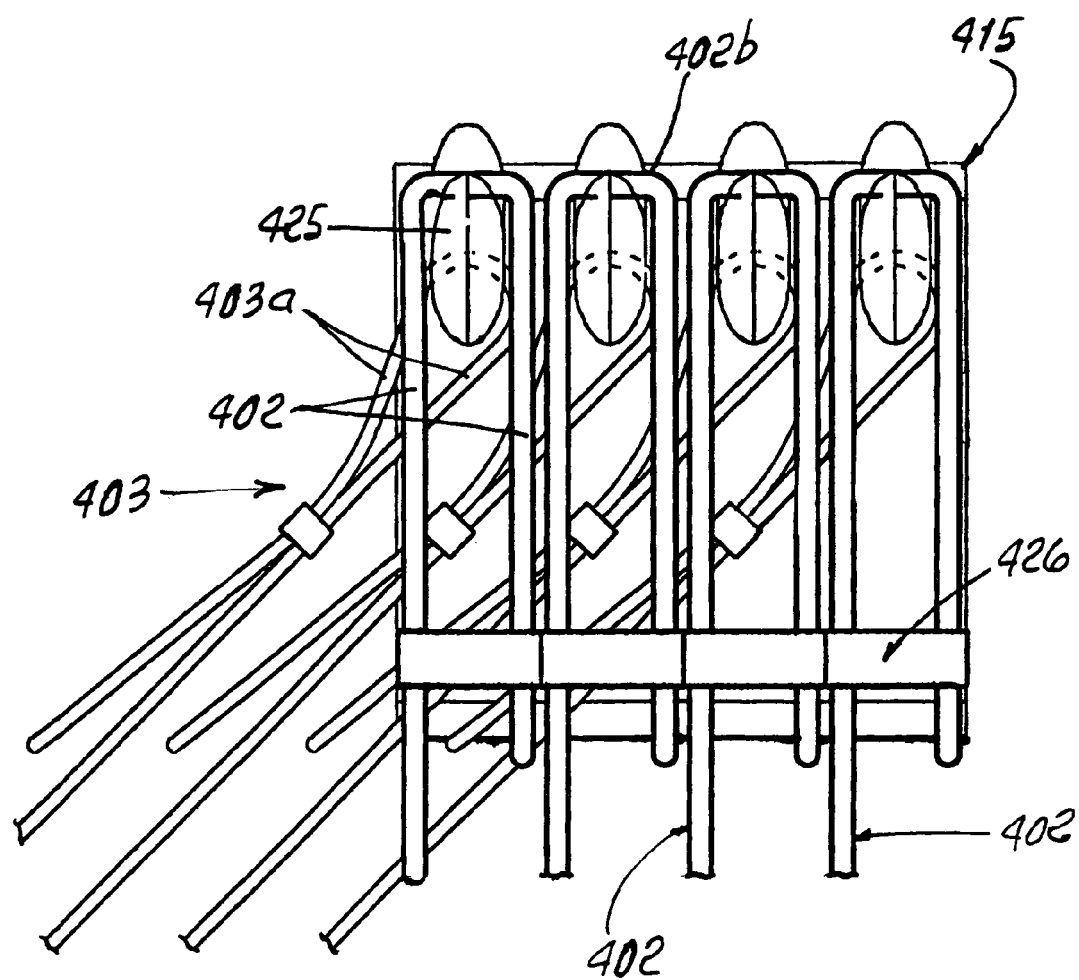

ELECTRONIC ASSEMBLY/SYSTEM WITH REDUCED COST, MASS, AND VOLUME AND INCREASED EFFICIENCY AND POWER DENSITY

BACKGROUND OF THE INVENTION

This application claims priority over provisional application Ser. No. 60/405,826 filed Aug. 26, 2002.

The apparatus described and claimed herein relates generally to electronic-optical packages, and more particularly to grids or arrays of such packages supported in such manner as to facilitate their installation and use as in closely assembled or packed configurations. Provisional application Ser. No. 60/405,826 is incorporated herein by reference.

Large-scale LED displays are typified by the use of T 1¾ (5 mm) packaged LEDs soldered to rigid printed circuit boards. Such circuit board/modules typically contain a large number of LEDs and must be replaced to correct for the failure of even a single LED. In addition to cost, weight and volume issues or problems, these displays are limited in resolution as a result of the LED package size (typically 0.2 inches in diameter), or about 300 times the plan form area of a bare LED (8000 times the volume), and they are limited in brightness by the small number of LEDs that can be placed in a given area, and also by the thermal resistance of the package and module design. The resolution limit is a function of spacing that is further restricted by package (LED) size. The brightness limit is a function of the number of LEDs per unit area and their individual light output, which is further dependent on the thermal resistance between the LED junction and the local environment. Also, existing LED signage and displays have limited ability to tailor the radiation emission pattern to the needs of the target/audience and thereby increase efficiency. Increased efficiency allows for reduced system and operating cost and/or more radiation delivered to the target.

There is need for improvements in LED display assemblies that overcome problems of heating and inability to adequately transfer or dispose of heat generated by LED operation; problems of inadequate LED support on substrates or circuit boards; problems resulting from lack of flexibility of the LED support means; difficulties in manufacturing close packed LED displays; and other problems and difficulties as will appear.

SUMMARY OF THE INVENTION

An exemplary embodiment provides method and means for overcoming the above identified problems. Basically, the improved LED display assembly comprises:
 a) an array, forming a grid or array of electrical conductors,
 b) light emitting diodes in association with the array and in electrical communication with the conductors that provide power for LED operation,
 c) the array operable or operated to receive heat from the diodes during diode operation, and the array or grid configured for passing coolant fluid for transfer of heat to the fluid.

As will appear, the electrical conductors typically and advantageously may comprise insulated metallic wires which may be interwoven or configured to act as electrical and thermal conductors, and that also may serve as structural supports for arrays of LEDs. The LEDs may be selectively removed or replaced on such supports.

An exemplary embodiment of the improved apparatus provides an LED supporting means, such as a grid characterized by ease of conformance to selected shape, curvature, or complex configuration after the LED array is attached to the grid, the grid having flexibility to enable such compliance to desired shaping.

Another feature is to effect and/or guide flow of coolant fluid through or along a shape compliant screen incorporating such LEDs. In this regard, the screen is amenable to fitting to
 i) a substrate on which LEDbases are placed, and/or
 ii) a superstrate associated with the screen and LEDs to provide structural strength to the assembly.

Yet another exemplary embodiment includes a first protective sheet facing the diodes to pass light emitted by the diode array; and a second sheet at the opposite side of the screen and diodes, the first and second sheets forming an enclosure within which coolant fluid is flowable. The screen itself may be dark or darkened to increase viewing contrast with the LED array, during its operation.

The electrical conductors may include primary conductors extending generally in one direction, and secondary conductors extending generally in another direction, the LEDs mounted on the primary conductors, and having terminals extending to the secondary conductors for electrical association thereto. In this regard, secondary conductors are typically characterized by one of the following:
 i) substantial spacing therebetween to pass coolant fluid through the screen,
 ii) reduced spacing therebetween, to pass coolant fluid primarily parallel to the screen,
 iii) cross sections which are substantially less than the cross sections of primary conductors which support diodes,
 iv) junctions with diode wires.

Yet another exemplary embodiment includes a screen display incorporating diodes or diode devices, wherein each diode includes a light emitter or emitters, a transparent container having a window area, the emitter supported within the container, and a reflector within the container to reflect emitted light toward said window. As will appear, an electrical lead or leads may extend with helical configuration within the container, such as a glass tube, to the emitter or emitters. The lead or leads may have flattened, or generally rectangular cross sections for stable support of the emitter or emitters.

A further exemplary embodiment includes provision of a metallic base carrying the container, and through which said lead or leads extend. The base typically has an edge portion defining a recess for reception of a support for the diode, allowing diode rotation about the support. Multiple of the diodes may be supported by a conductor or conductors in a screen, and to have their windows oriented to face in the same or selected directions. The diodes may be rotatable about axes defined by their supporting conductors.

Additional objects include provision of certain power providing conductors that comprise first, second, and third pairs of wires to transmit electrical energization to red, green and blue LED pixels, respectively; provision of LED primary, secondary and tertiary wires electrically connected to the red, green and blue pixels, respectively, said primary wire clamp connected to said first pair of wires, said secondary wire clamp connected to said second pair of wires, and said tertiary wire clamp connected to said third pair of wires; provision of clamped nesting of said primary, secondary and tertiary wires; provision of certain conductors that extend at an acute angle or angles relative to others of said conductors; provision of protector means such as a plate or plate, or a screen or screens at the front or rear of the grid, and with air passing openings, as will appear.

These and other objects and advantages, as well as the details of illustrative embodiments, will be more fully understood from the following specification and drawings, in which:

DRAWING DESCRIPTION

FIG. 3 is a view like FIG. 2 but showing coolant flow primarily through the screen and past diodes;

FIG. 4 is a top plan view of an array of diodes on a screen similar to that of FIG. 1, and showing open spaces between conductors to pass coolant fluids;

FIG. 5 is a top plan view of an array of diodes on a screen, similar to that of FIG. 2, the conductors being closely packed;

FIG. 6 is a view like that of FIG. 5, but showing a different configuration of electrical conductors;

FIG. 25 is a section taken through an LED package;

FIG. 26 is a section taken on lines 26—26 of FIG. 25;

FIG. 28a is a modification;

FIG. 45 is an enlarged and rotated view of FIG. 42;

FIG. 46 is a front elevation showing locations of pixel packages on a fragmentary grid of addressing wires arrayed at 45° relative to conductor wires;

FIG. 47 is an enlarged view, like FIG. 44, but taken at the opposite end of the grid;

DETAILED DESCRIPTION

Figure 1A:
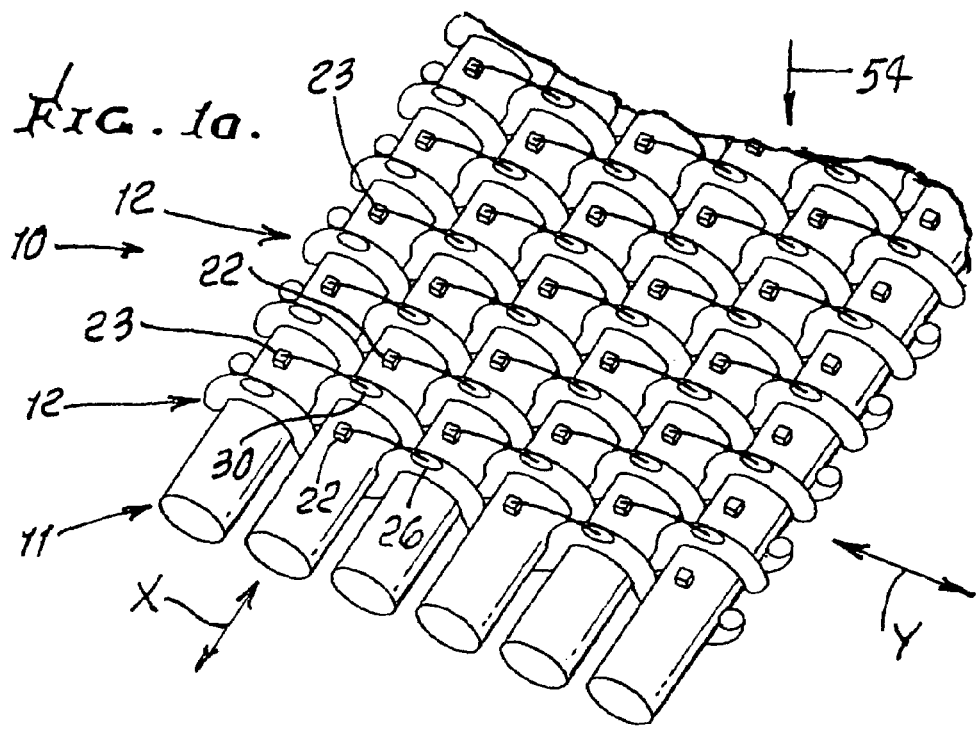
FIG. 1 is a perspective view of one form of grid or screen incorporating LEDs.

FIG. 1 shows a screen 10 forming a grid of electrical conductors. As illustrated, the conductors include like primary conductors 11 extending generally in one direction, and designated as an X-direction; and secondary conductors 12 extending generally in another direction, designated as a Y-direction. As shown, the primary conductors preferably have overall diameters $d_1$ or cross sections greater than the overall diameters $d_2$ or cross sections of the secondary conductors, and the latter extend over and under the conductor 11 in a weaving or mesh relationship as at 12a and 12a'. There is space as at 15 between successive parallel conductors 11; and there is space as at 16 between successive undulating conductors 12, whereby coolant can flow downwardly through the screen via spaces 15 and 16 and near or adjacent diodes, to remove heat generated by diode operation.

Light emitting diodes are located or mounted in an array on various conductors, as shown on crests of conductor 12, and in such manner that each diode is in electrical communication with two conductors, establishing a circuit path from a conductor 11 to a conductor 12, via the diode internal circuit. See conductor energization controls 20 and 21 for two representation diodes 22 and 23, with circuit paths (for diode 22) at 24, 11a, 22, 25, junction 26, 12a, 12b and 27; and circuit paths (for diode 23) at 28, 11b, 23, 29, junction 30, 12a, 12b, and 29. Controls 20 and 29 are interconnected so that diodes 22 and 23 can be selectively energized in timed relation. Diode 22 is mounted on the top side or crest of conductor 11a, and diode 23 is mounted on the top side of conductor 11b. Other diodes as shown are similarly mounted and selectively controlled by controls indicated in bank 31, controls 20 and 21 considered as part of that bank. Electrical connections to metallic wires in the conductors are made by removal of or penetration through conductor insulation. Wires 25 and 29 extend in the Y-direction, and may be insulated. Junctions as at 26 and 30 are provided on all crests of secondary conductors 12, and all LEDs are mounted on conductors 11, and protectively between sequential crests of conductors 12.

Figure 7:
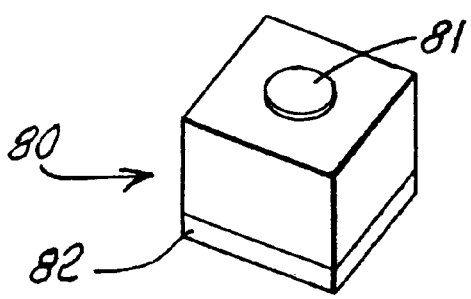
FIGS. 7 and 8 are perspective views of two different forms of LEDs.
Figure 8:
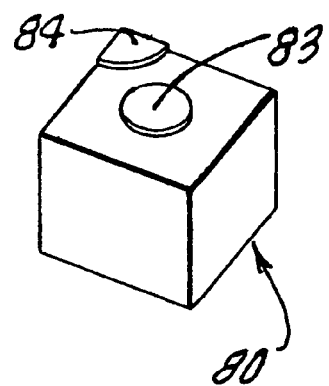
Figure 9:
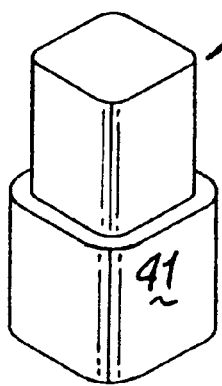
FIGS. 9–12 are perspective views of sections of electrical conductors.
Figure 10:
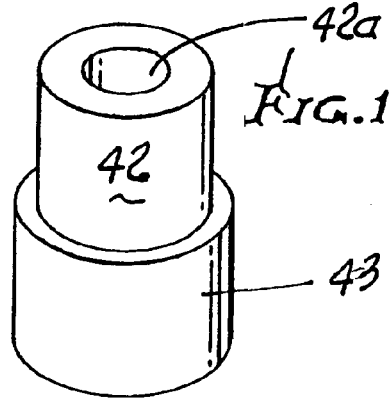
Figure 11:
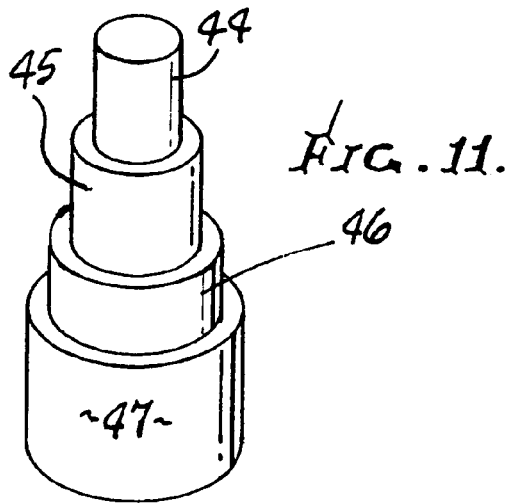
Figure 12:
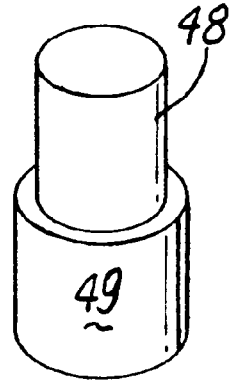

The electrical conductors may comprise insulated metal wires that act as electrical and thermal conductors and that also serve as structural load conductors, for arrays of such diodes. See for example FIG. 9 showing metallic conductor 40 having a square cross section, and a layer 41 of dielectric insulation thereon; FIG. 10 showing metallic conductor 42 having tubular cross section with bore 42a, and a cylindrical layer 43 of insulation thereon; FIG. 11 showing circular cross section metallic wire at 44, tubular insulation layer 45, tubular cross section metallic wire 46, and tubular layer of insulation 47; and FIG. 12 showing solid metallic wire 48 and insulation 49 thereon, 48 being circular and 49 being tubular. FIG. 7 shows a six-sided LED body 80 with electrical terminal areas 81 and 82; and FIG. 8 shows a similar LED body with terminal areas 83 and 84.

FIG. 1a is like FIG. 1, showing an array of LEDs 23 and 24 staggered in the Y-direction at one side of the screen defined by the interwoven conductors 11 and 12. Coolant such as air flows at 54, downwardly toward and over the diodes and through the screen defined by spaced conductors 11 and 12. Air may also be caused to flow generally parallel to the screen, as in the X or Y direction, to cool the screen and diodes. Heat generated by the diodes is carried away by coolant flow. Note diode wire junctions 60 with and at the tops of the supporting conductors 12, maximally exposed to coolant flow for heat transfer to coolant. The conductors 11 are large enough in diameter to support the mounted and exposed diodes 22 and 23 and other similar diodes, arrayed as shown.

Figure 2:
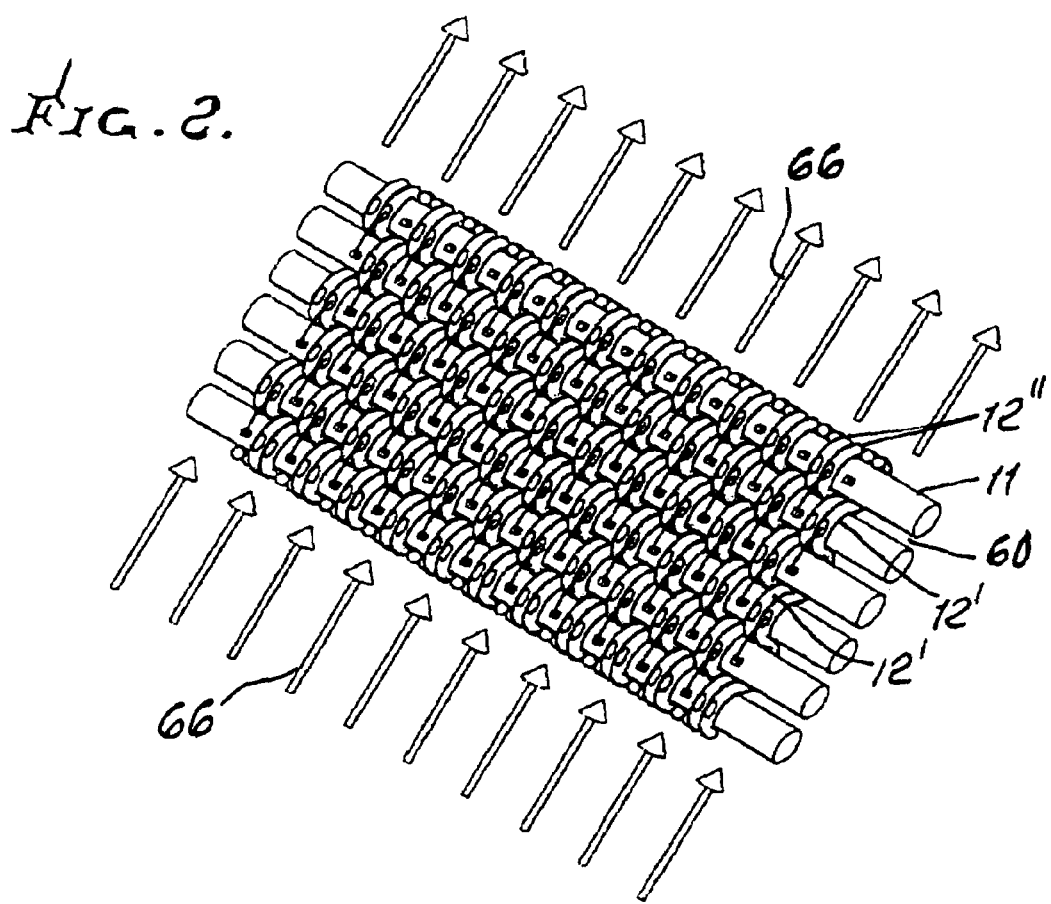
FIG. 2 is a perspective view of another form of grid or screen incorporating LEDs.

In FIGS. 2 and 5, the conductors 11 are generally the same as the conductors 11 in FIG. 1, and are spaced apart as seen at 60. The conductors 12 are arranged in side by side pairs, as seen for example at 12' and 12', and 12" and 12". Successive pairs of such conductors pass over and under conductors 11, as shown. Like pairs 12' pass together over a conductor 11, along its length, and like successive pairs 12" pass together over the next conductor 11, along its length in staggered relation in the X-direction in relation to closest pairs 12'; and portions of the pairs 12" nest between portions of the pairs 12', at locations 62 between conductors 11, as is clear from FIG. 5. A close packed assembly is thereby achieved. As before, LEDs 23 are mounted on exposed tops of sequentially alternate conductors 11b and LEDs 22 are likewise mounted on exposed tops of sequentially alternate conductors 11a. Each LED has a wire 63 connecting it to the top of a conductor 12 in a pair of such conductors, as at a junction as seen at 64. Insulation is removed or penetrated to enable electrical communication between LED wire 63 and the metal wire within a conductor.

In FIG. 2, coolant is shown flowing at 66 parallel to the plane of the conductor formed screen; and in FIG. 3, coolant is shown flowing at 67 generally normal to the plane of the conductor formed screen, and through the screen, for removing heat from the LEDs and screen, such heat produced by LED operation. FIG. 3 is generally like FIG. 5, except that the pairs of conductors 12' and 12' are spaced from the pairs 12" and 12" to form air passing openings.

FIG. 4, which is an assembly similar to that shown in FIG. 1, illustrates provision of spaces 66 formed between successive straight conductors 11 in the Y-direction, and between undulant over and under extending conductors 12 in the X-direction. Those spaces facilitate flow of coolant fluid through the screen or grid of conductors. The X and Y directions are substantially normal to one another.

It will be understood that the screen as shown facilitates its bending or warping, particularly about an axis or axes parallel to the X-direction extents of conductors 11 to conform the screen to desired shape or shapes. This may alter the perceived LED illumination emanating from different portions of the screen, as may be desired.

In FIG. 6, the conductors 11 are arranged to extend in spaced parallel relation in the X-direction, as in FIG. 1. Successive conductors 12 are closely packed, so that portions 12a' of conductors 12a closely nest between portions 12b' of conductors 12b, conductors 12a alternating between conductors 12b. LEDs 23 are located on the exposed tops of conductors 11b, whereas LEDs 22 are located on the tops of conductors 11a which alternate between conductors 11b. Wires from LEDs 22 extend to junctions 26 at the tops of conductors 12b overlying conductors 11b, whereas wires from the LEDs 23 extend to junctions 30 at the tops of conductors overlying conductors 11a.

Figure 13:
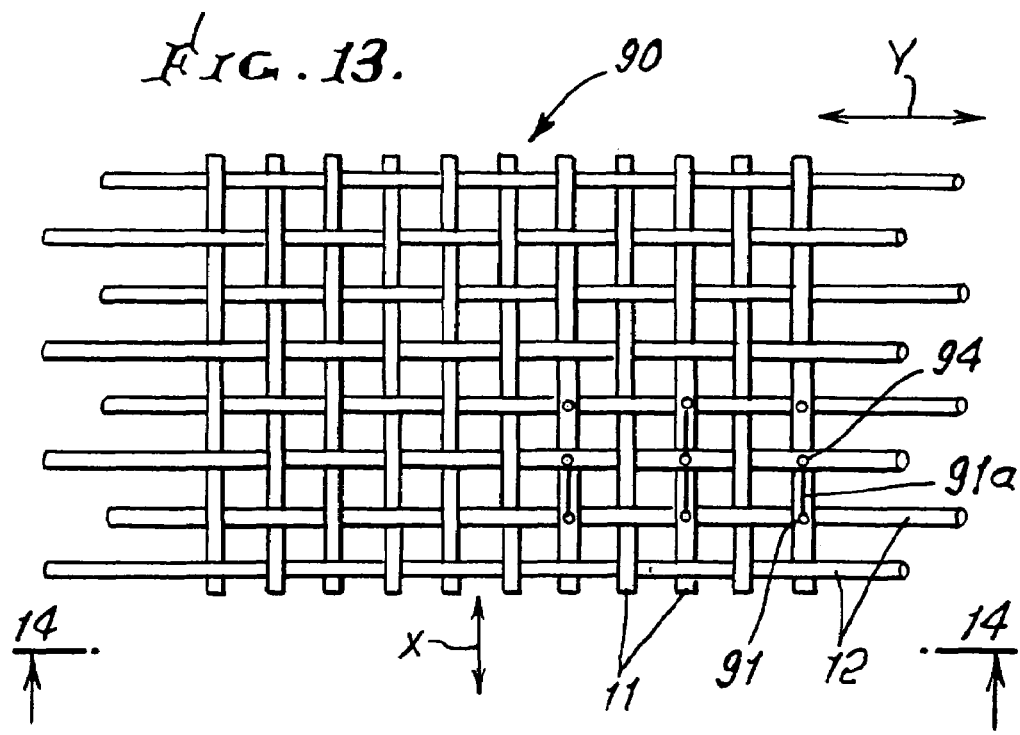
FIG. 13 shows weaving of electrical conductors.
Figure 14:
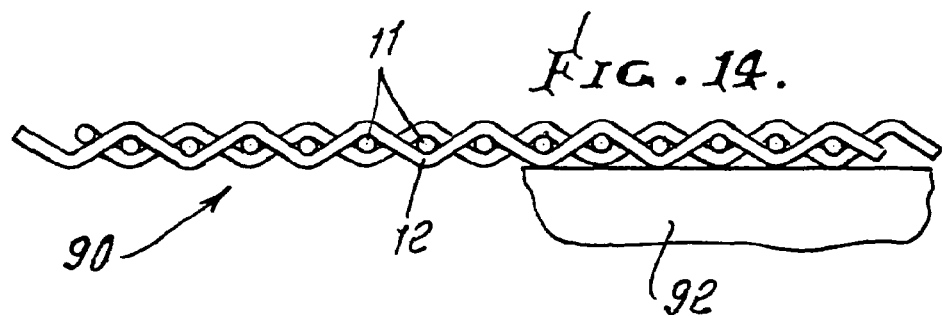
FIG. 14 is an edge view taken on lines 14—14 of FIG. 13.

FIGS. 13 and 14 show a mesh 90 of interwoven conductors 11 and 12, with LEDs 91 at the crests of conductors 11, which have wave-like configuration, as do conductors 12. This facilitates bending or warping of the screen or mesh about axes extending in both the X and Y direction, to accommodate to desired curved shaping as on object 92. LED wires 91a extend to junctions 94 on conductors 12.

Figure 15:
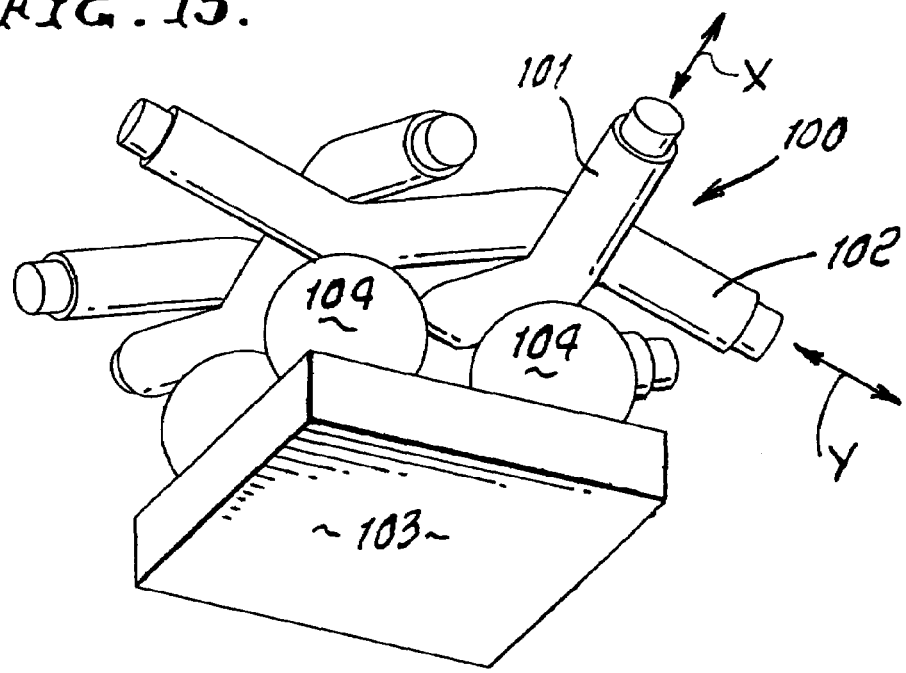
FIG. 15 is a perspective view of a ball grid connection to a screen.
Figure 16:
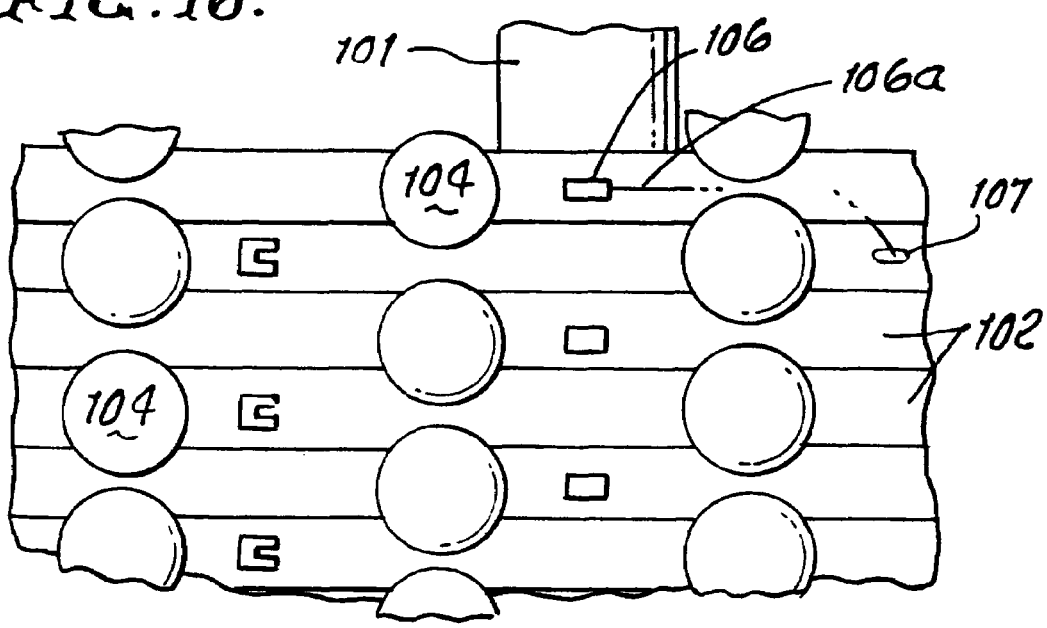
FIG. 16 is a plan view of a ball grid connection to a screen.

FIGS. 15 and 16 show a screen or mesh 100, similar to mesh 90 in FIGS. 13 and 14, with X direction conductors 101 interwoven with Y direction conductors 102. A substrate 103 extends beneath the mesh, and dielectric spacers such as spheres or balls 104 are located between 100 and 103 to engage and position them relative to one another. In FIG. 16, LEDs 106 mounted on crests of conductors 101, have wires 106a extending to junctions 107 on crests of conductors 102.

Figure 17:
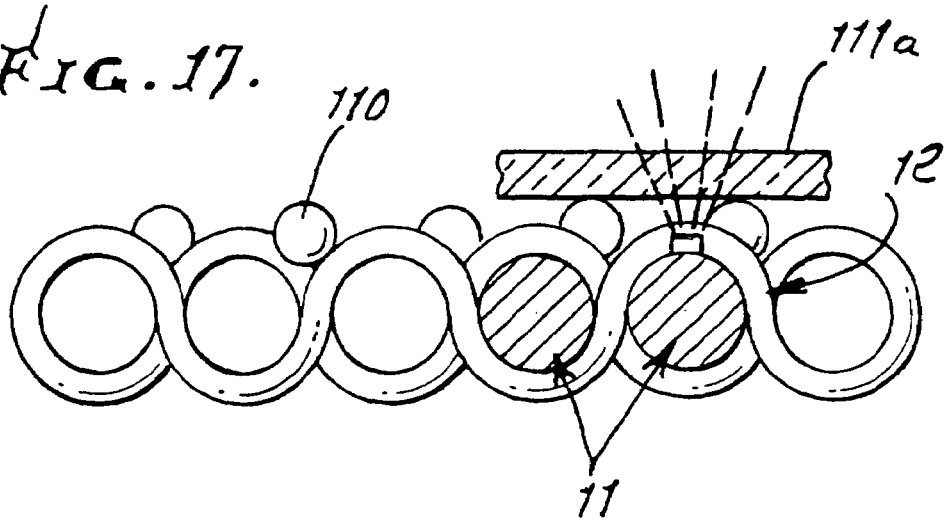
FIG. 17 is an elevation showing a ball grid connection to a screen.

FIG. 17 shows positioning balls 110 between the tops of conductors 12 woven above and below conductors 11. Balls 110 also serve as protection and spacing means. LEDs are mounted on conductors 11 between conductors 12. A superstrate 111 may be located at the tops of the balls 110. Superstrate 111a may be a transparent plate, to pass light emitted by the LEDs.

Figure 18:
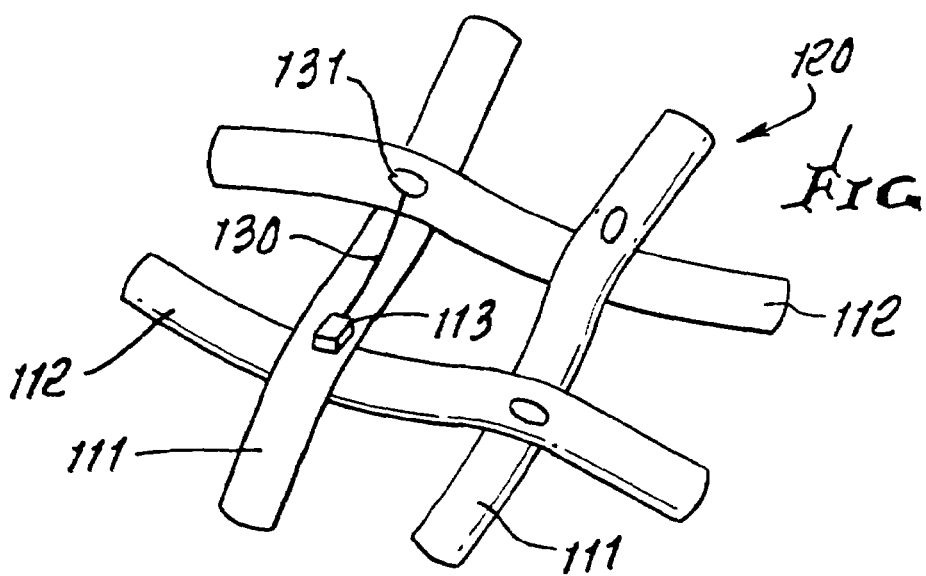
FIG. 18 is a perspective view showing yet another screen configuration.
Figure 19:
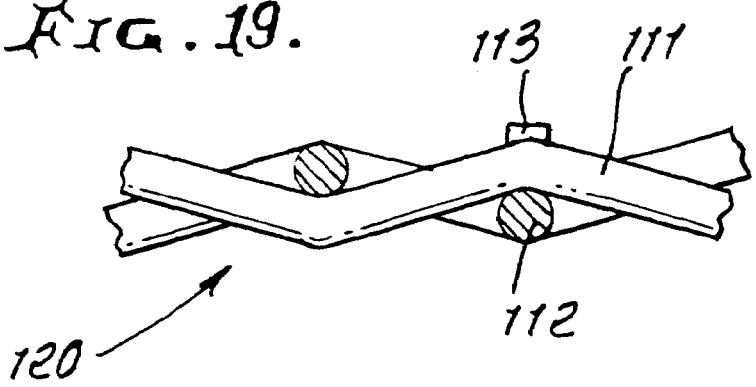
FIG. 19 is an edge view of the screen of FIG. 18.
Figure 20:
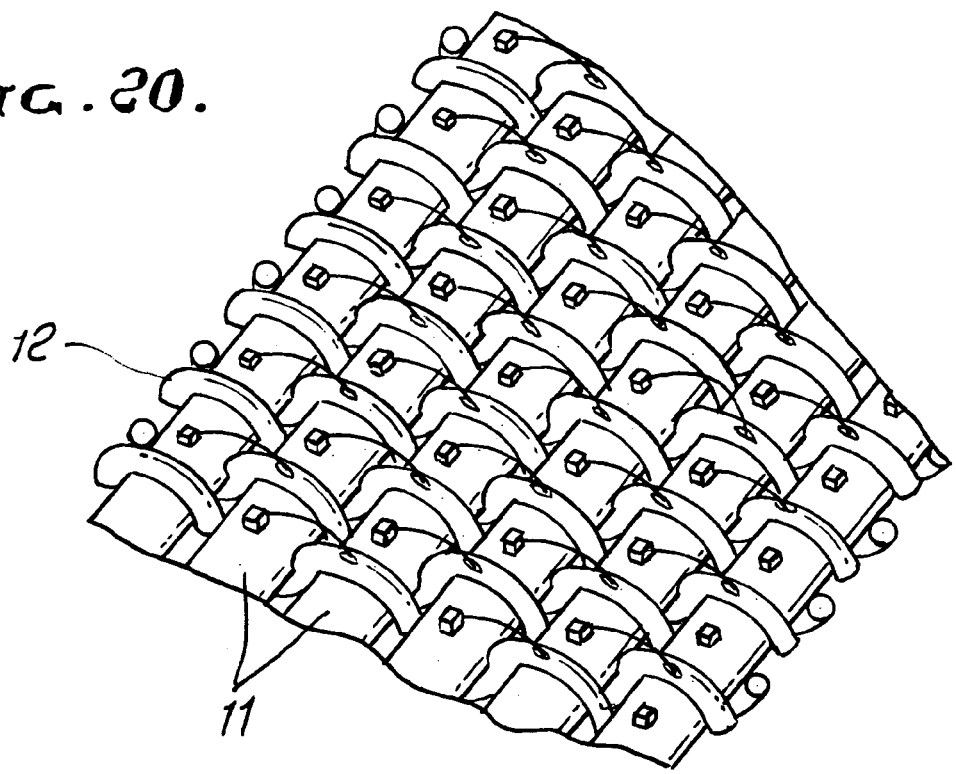
FIGS. 20–23 show arrangements of electrical conductors forming screens, and arrays of LEDs mounted thereon.
Figure 21:
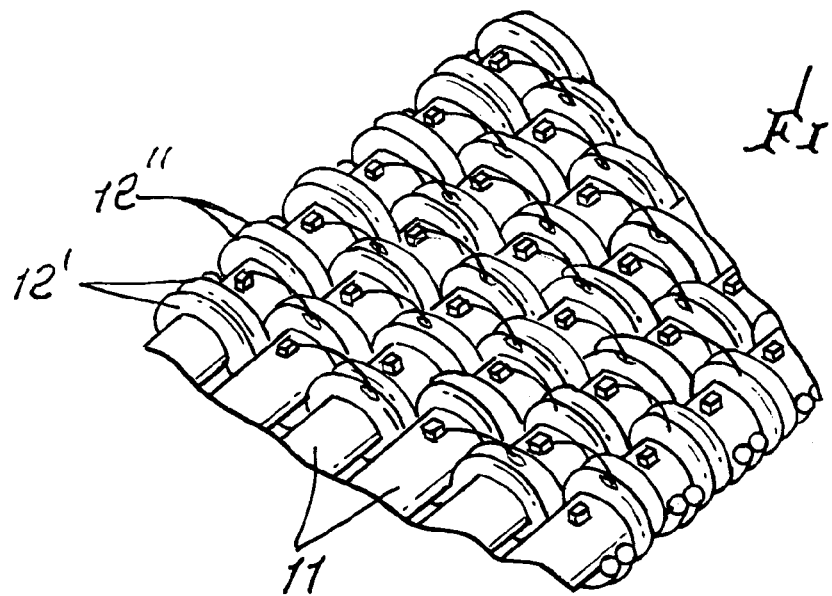
Figure 22:
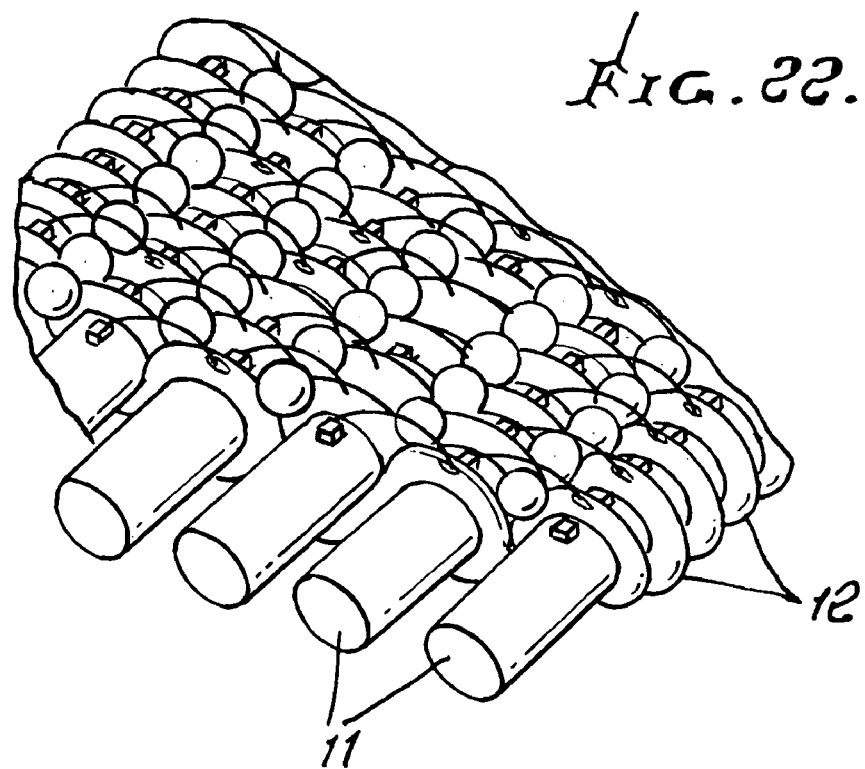
Figure 23:
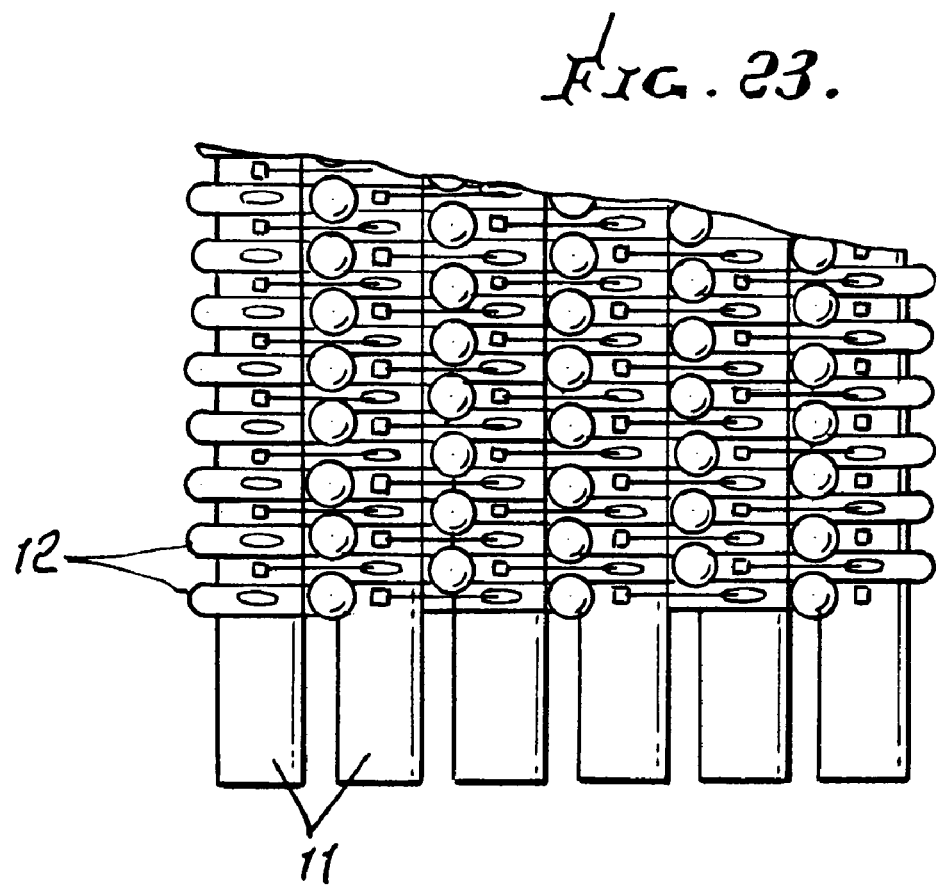

FIGS. 18 and 19 show a mesh 120 similar to that seen at 90 in FIGS. 13 and 14. The "open-weave" conductors are seen at 111 and 112; and LEDs 113 are mounted on crests of certain conductors such as 111. LED wires 130 extend to junctions 131 on conductors 112. The latter may have concentric configuration.

FIGS. 20–23 show alternative screen and LED configurations.

Figure 24:
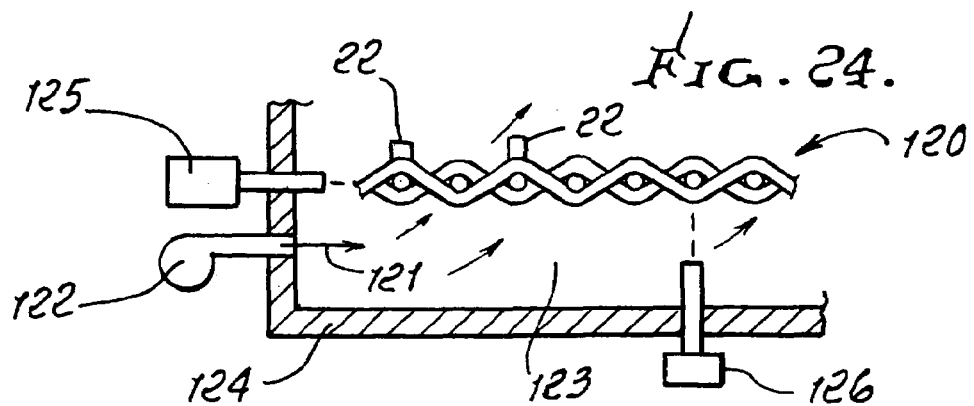
FIG. 24 is a view showing screen cooling.

FIG. 24 shows a screen 120 like any of the described screens, with cooling air 121 blown at 122 into a space 123 below the screen, to flow adjacent the screen and upwardly through the screen. A housing is seen at 124. Actuators 125 and 126 may be provided to actively and repeatedly displace, deform or warp the screen, as for an active sign display.

Referring now to FIGS. 25 and 26, the illustrated LED or LED "pixel" package, or diode package 150 includes a light emitter or emitters 151 within a transparent container, one example being a glass tube 152 having a hemispherical end 152a. A window area 152b is defined by tube 152, or container, for transmission of emitted light in a direction or directions 153. A reflector 154 is located within the tube, and has a reflecting surface 154a for reflecting emitted light in a forward direction 153, through the window and to the exterior. The reflector may have edges 154b engaging or supported by the tube interior wall 152c.

An electrical lead or leads indicated at 156 extends with helical configuration into the tube and within the tube, to the emitter or emitters, that configuration providing support. The lead or leads preferably has or have a flattened or generally rectangular configuration seen in FIG. 26. Wires contained in the lead or leads may include "red", "green" and "blue" (relating to emitted light color) and an additional wire, such as an electrical neutral or return wire, to the emitter or emitters. The wires may consist of AWC32 copper multifilar and or AWC26 copper wire or AWG26 4 conductor insulated copper multifilar wire helically wound around a rectangular cross-section AWG18 insulated copper wire. A metallic, as for example aluminum base 157, has an edge recess 158 receiving the end of the tube 152, and supporting the tube. Specularly reflecting aluminum walls 159 and 160 are provided in the tube, and support the reflector 154, as at endwise locations 161 and 162. The base 157 defines a through opening 163 passing the lead or leads; the base also defines an end recess 164 filled with potting compound 165 as for example epoxy resin. The lead or leads pass through that compound. The base also has an edge portion defining an annular recess 168, for reception of a package support or support portion 169, as for example a portion of the conductor 11a as seen in FIG. 1. The recess 168 preferably has cylindrical wall configuration, allowing rotation of the diode about an axis 170 defined by the recess or conductor. Diode or pixel replacement is also facilitated. Lead wires may be connected to conductors 11 and 12 of the screen, as referred to above.

Figure 27:
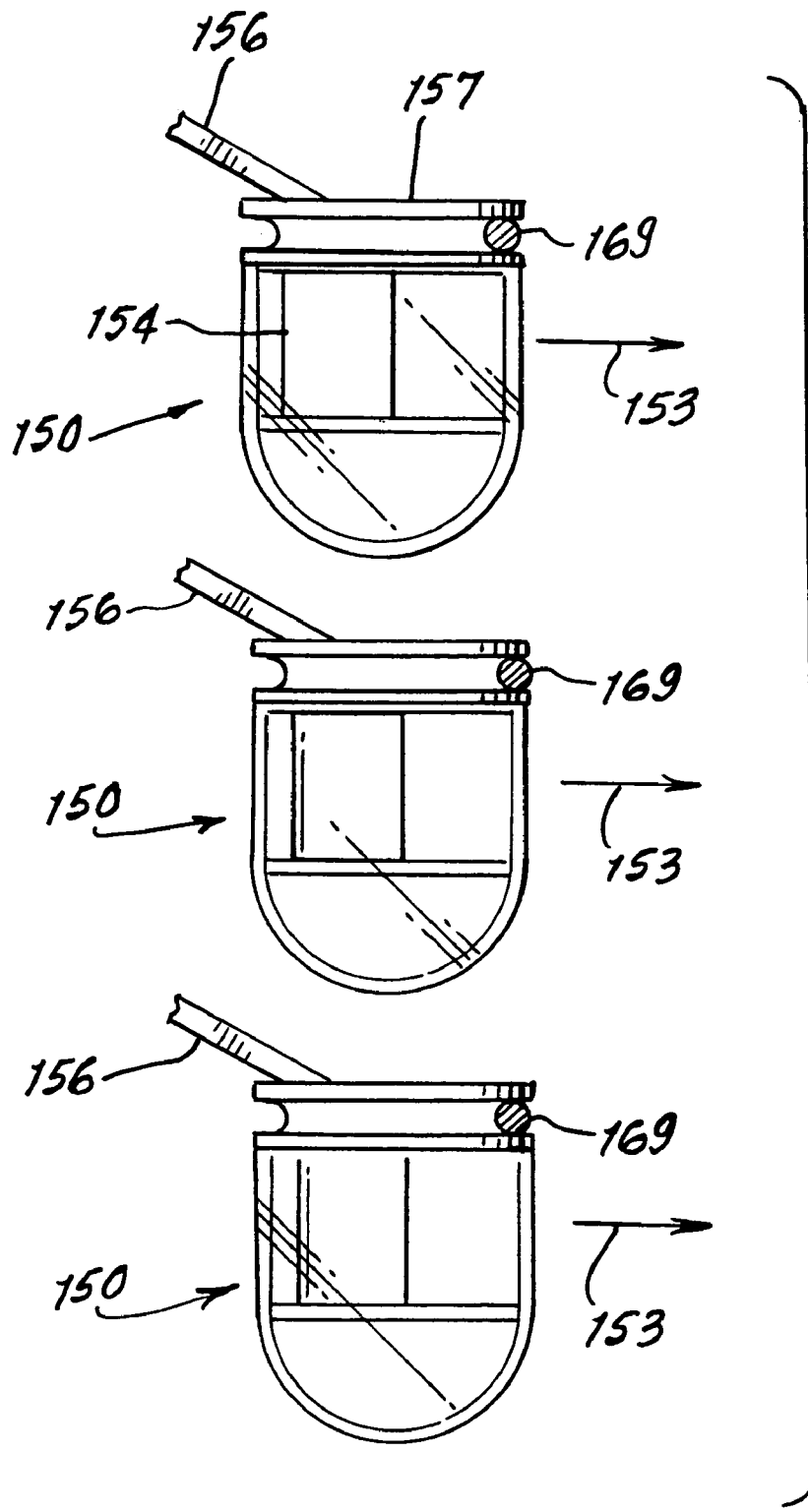
FIG. 27 is a view showing a display embodying multiple LED packages of the type shown in FIGS. 25 and 26.
Figure 28:
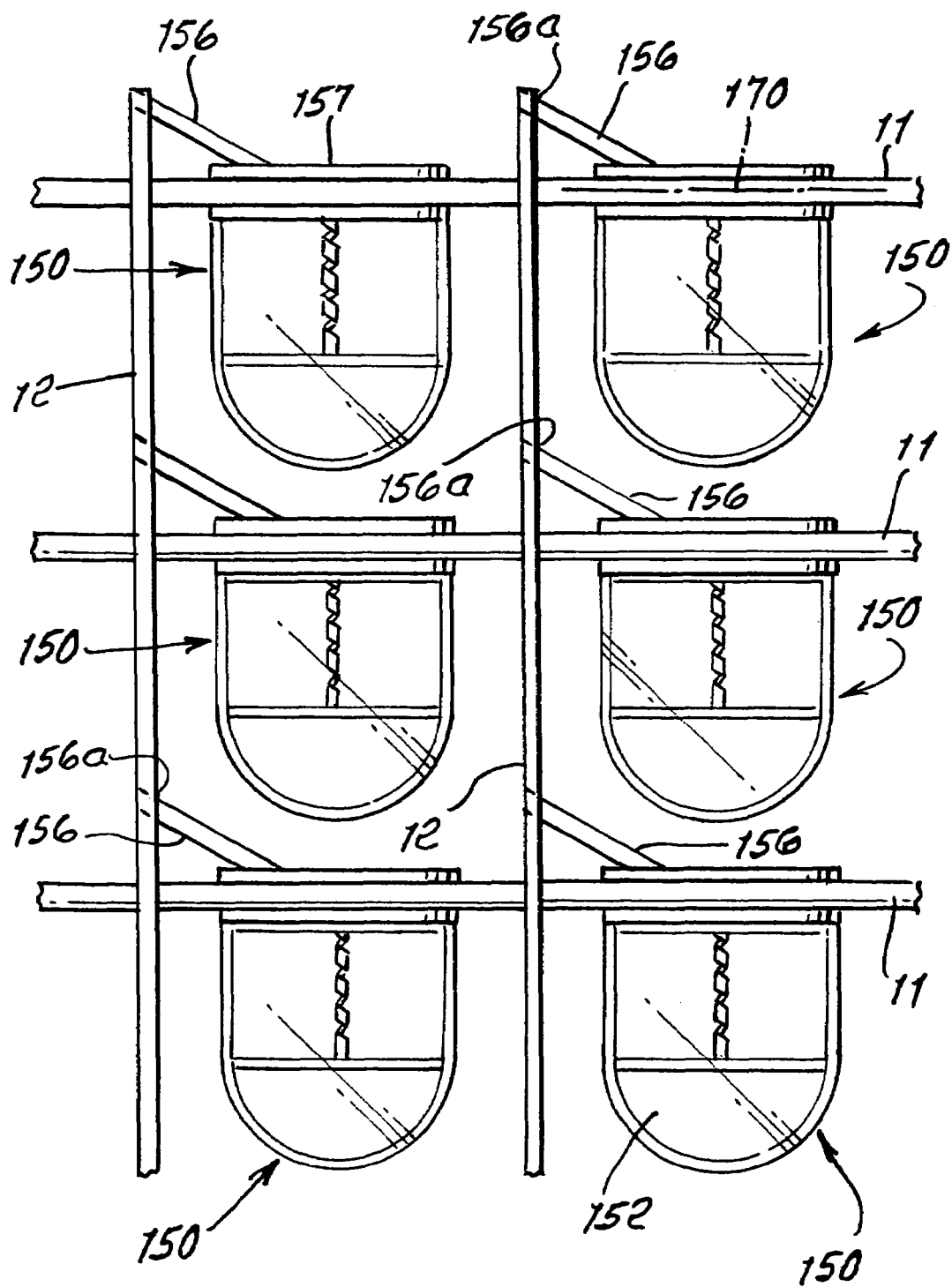
FIG. 28 is a view showing a display embodying multiple LED packages as shown in FIGS. 25 and 26, the packages mounted on a conductor screen of the type shown in FIG. 1.
Figure 29:
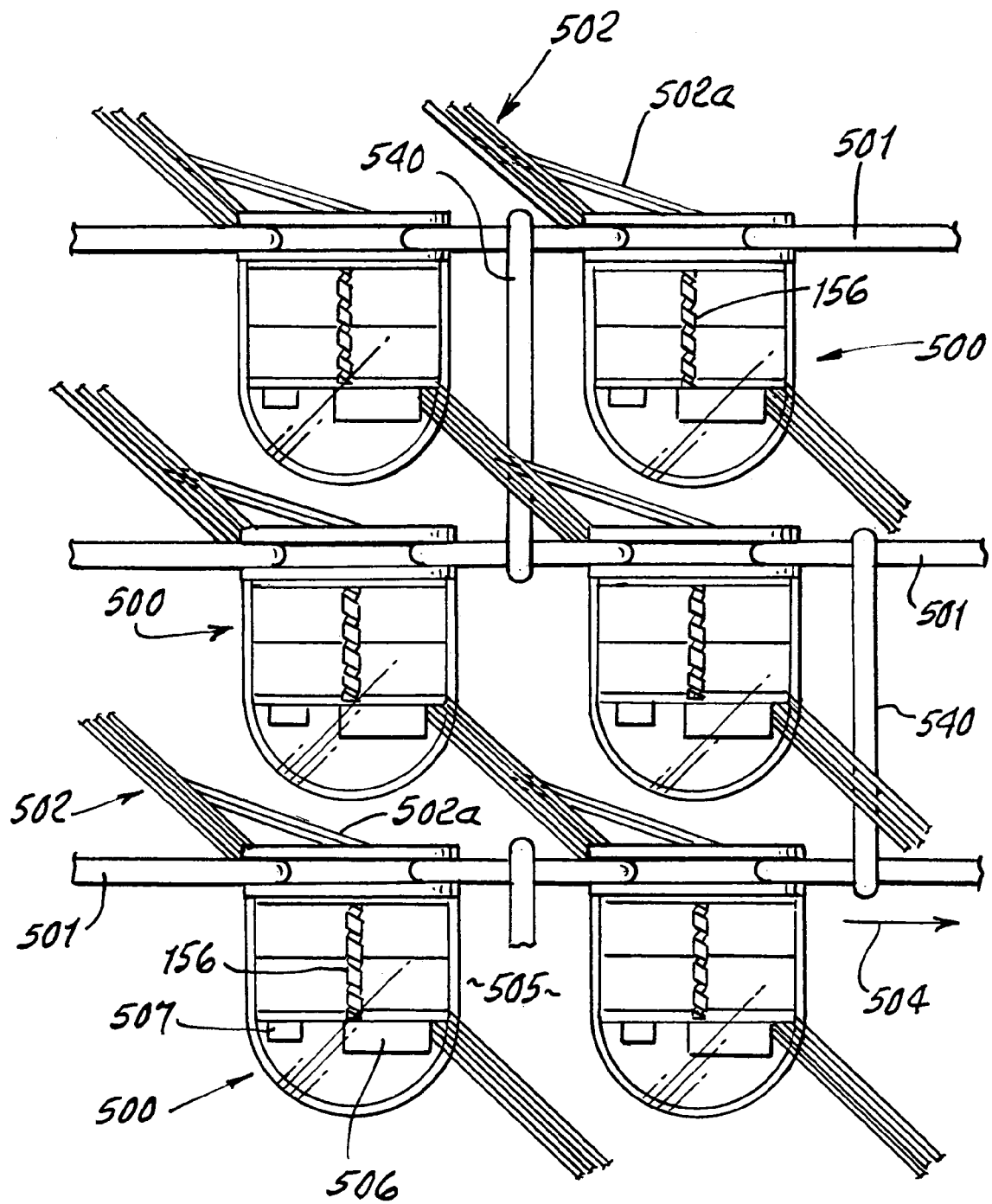
FIG. 29 shows an LED package mounted on a screen conductor and transmitting light to a reflector.

FIG. 27 shows the LED packages 150 of FIGS. 25 and 26 arranged in a display sequence or configuration. FIG. 28 shows the FIGS. 25 and 26 LED packages mounted to mesh defining conductors 11 and 12, so that the LED packages are carried by the mesh conductors 11 and are rotatable about axes 170, as referred to. Integrated pixel electronics is thereby provided. Note leads 156 connected at 156a to conductors 12. FIG. 29 shows LED package 150 mounted on a conductor 11, and transmitting light to a reflector 180.

Figure 30:
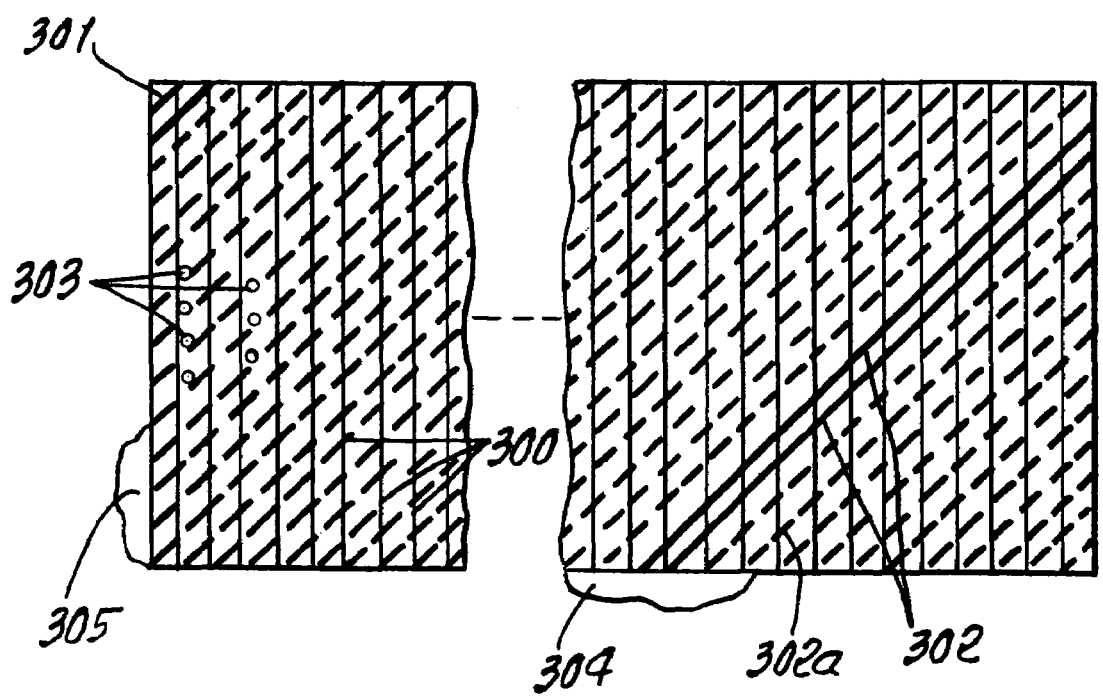
FIG. 30 is a schematic diagram of a sign that incorporates the LED supporting grid, and with address wires extending at acute angles.

FIG. 30 shows a sign or array employing LED packages as disclosed. The display incorporates vertical conductors 300, with representative addressing wires 301 and 302 extending at acute angles, for example 45° across and relative to wires 300. Wires 301 are extensive of wires 302 in a geometric sense. Other addressing wires are indicated in broken lines, as at 302a. LED packages are shown at 303 carried by wires 300. This configuration, shown schematically, achieves reduced lengths of addressing wires, as compared with horizontal wires. Connections 304 and 305 to wires 300, 301, and 302a are made at the screen, i.e. array perimeter.

Figure 31:
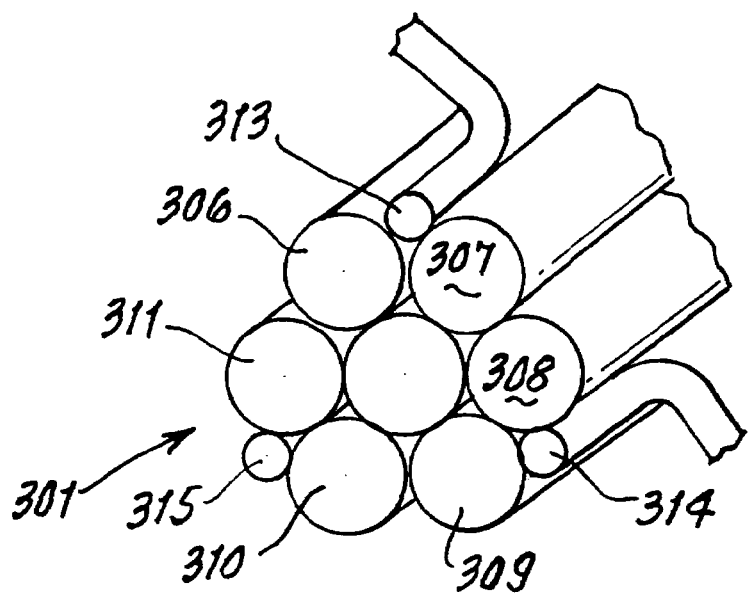
FIG. 31 is a perspective view of a wire bundle.
Figure 32:
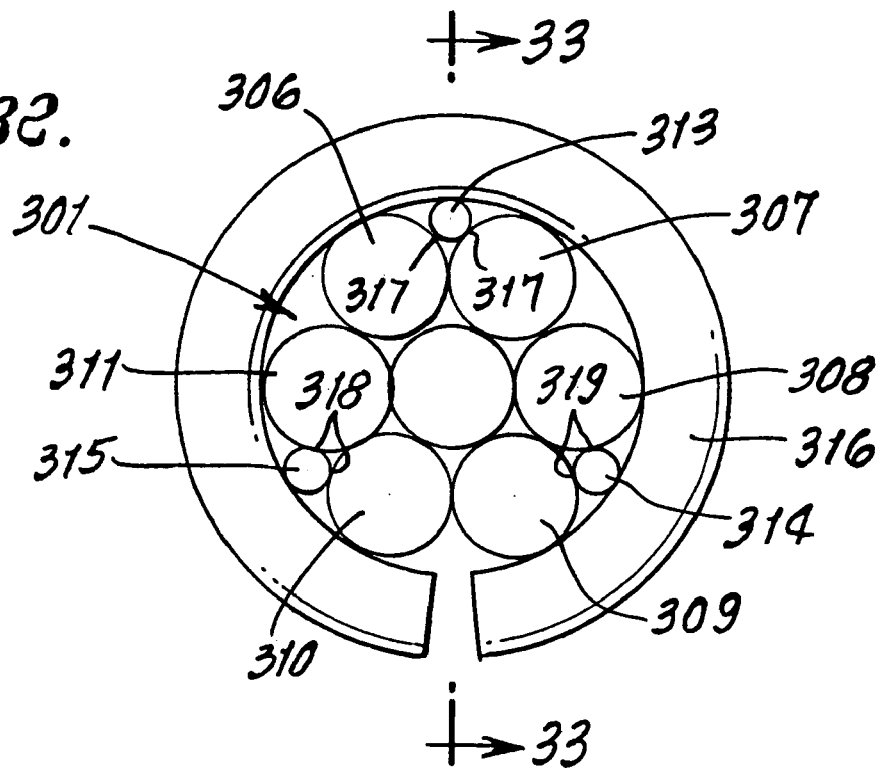
FIG. 32 is a cross section taken through the FIG. 31 wire bundle.
Figure 33:
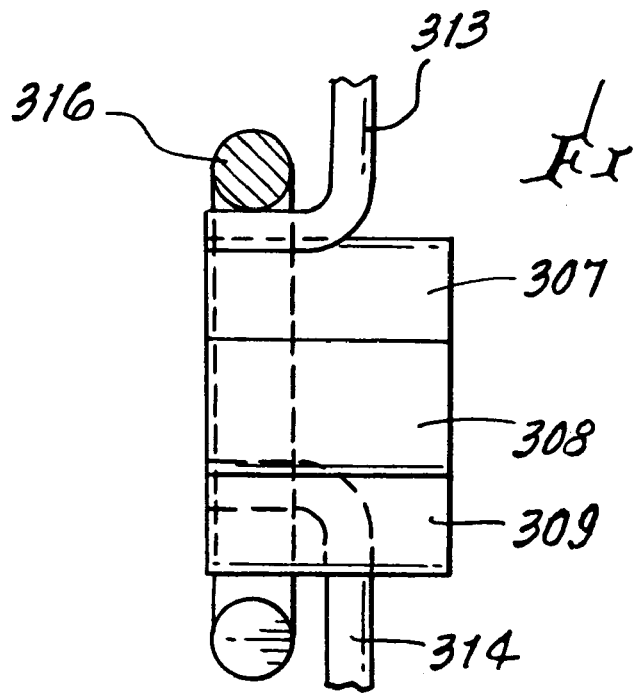
FIG. 33 is a section taken on lines 33—33 of FIG. 32.

FIGS. 31–33 are sections showing details of construction of the LED addressing wires which may be of multifilar construction. Referring to FIG. 31, wire 301, numerals 306 and 307 refer to LED red light emitting pair; 308 and 309 refer to green emitting pair; and 310 and 311 refer to blue light emitting pair. A pair of red AWG 18 insulated copper wires is used to activate the red LEDs for a row of pixels. This wire pair and its neighboring wire pairs may be helically wound around an insulated central core that may serve as a tensile element. AWG 26 insulated copper wires from the pixel may be nested between wire pairs of like color. An insulated metal retainer may be used to compress the pixel wires against the power supply wires.

Numerals 313–315 designate three insulated copper wires from the three pixels, respectively, nested between the referenced wire pairs. A small amount of insulation is removed at wire regions to establish electrical connection between 313 and 306 and 307; between 314 and 308 and 309; and between 315 and 310 and 311. A stainless steel retainer 316 extends about the wire assembly, and holds the wires in compression at the central regions, for example as seen at 317, 318, and 319 in FIGS. 32 and 33. The retainer may take the form of a split ring fastener that engages the wires 313–315 and may yieldably deform them at their contact points 317–319.

Figure 34:
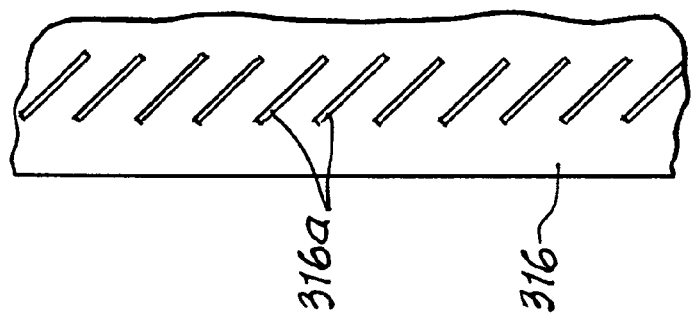
FIG. 34 is a view of protective metallic plate, with air passing openings.

FIG. 34 schematically shows a metal plate 316 that may be used and positioned as an absorber of sunlight that passes through a display sign array incorporating devices as described above. It also blocks light transmitted toward the rear of the sign array. As such, the plate 316 may be regarded as overlapping the array at the rear thereof. The angled slits 316a that extend through the plate pass cooler air (possibly blower induced) flowing in the space between the plate and the array. Plate 316 also provides mechanical protection at the back of the display. FIG. 34 also represents a side view of an array of overlapping elements that absorb sunlight and extraneous radiation while allowing the passage of cooling air. The array creates a thermal chimney effect to further increase cooling air flow and this effect may be further enhanced by the use of array surfaces with high absorptivity for sunlight and low emisstivity in the longwave infrared region. In addition the array provides mechanical protection for signage and display elements.

Figure 36:
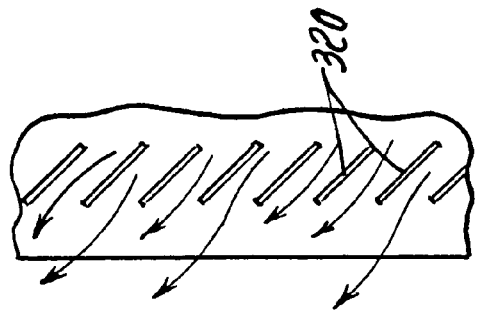
FIG. 36 is a view like FIG. 35, showing use of air passing louvers.
Figure 35:
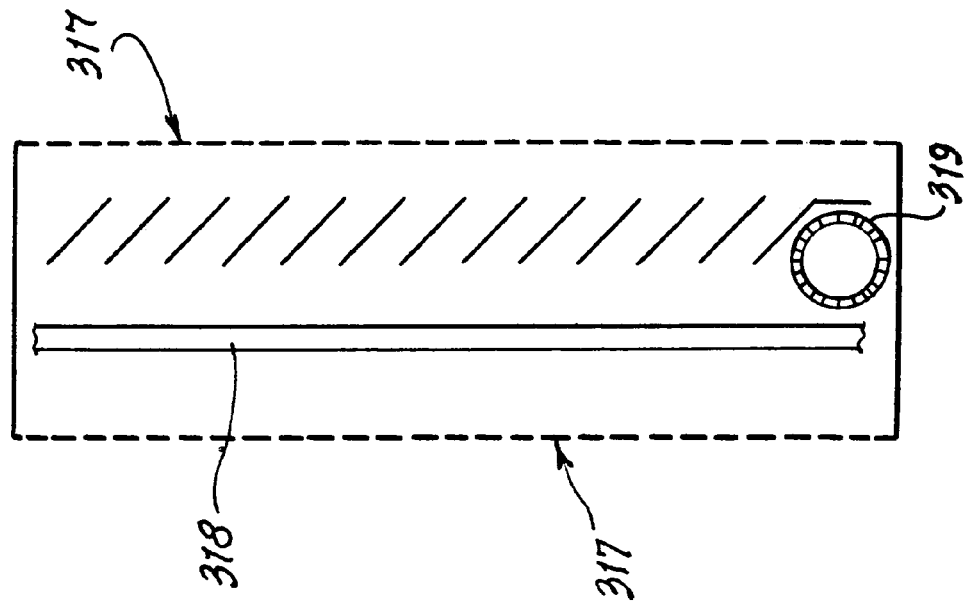
FIG. 35 is a section taken through a grid as described, with protective mesh at front and rear sides thereof.

FIG. 35 is a section showing protective metallic screens 317 at the back and front sides of the display array schematically indicated at 318. Such screens may pass cooling air, blower driven at 319. FIG. 36 is like FIG. 35, but shows louvers or slots 320 in place of screens 317.

Screens may be used in place of circuit boards and conductors on or as film circuitry. Screens can provide power and signal conduits as at 300 or 302 in FIG. 30, with reduced cost, mass, and volume, while providing paths between the conduits for flow of cooling fluids to allow systems/products with greatly reduced thermal resistance and/or increased power density operation. Screens may also allow optical communication between circuit elements via open regions between the wires. Screens greatly simplify the manufacture of 3D electronics, allow mechanical compliance, and may behave somewhat elastically to provide pressure type electrical contacts. Screens may have diodes electrically connected to the junctions between crossing wires and/or be in contact with electronic circuitry on chip or chips that provides diodes and/or electrically switchable elements to control the flow of electrons through the screen array. Connection schemes such as solder and including ball grid arrays are also a possible means of connection. Screen and chip arrangements include 'Z Fold' serpentine/sinuous screen with chips between each layer and spiral/helical screens with chips between each layer/rotation. Screens are also good candidates for neural net architectures. Connection with input/output elements may be via ends/edges of screens and employ contact means such as solder, conductive adhesive, and/or mechanical/pressure contact. See 304 and 305 in FIG. 30.

FIG. 28a shows modifications in the manner of supporting LEDs and their electrical connections, in an array. The LEDs appear at 500 and are adjustably, and/or removably supported on conductors 501, which may be power conductors, as described in FIG. 25. Addressing wires or conductors, are shown at 502, and may take the multi-filer form as shown in FIGS. 31–33. Wires 502 extend at acute angles (for example 45°) relative to conductors 501, extending in direction or directions 504. Coolant gas passing spaces between structure appear at 505. Local electronic circuitry, in the LED packages are seen at 506. Pixel package circuitry is indicated at 507 in the packages. Local addressing wire branches 502a extend (i.e. branch) from the wires 502 to 156, as described above. Wires 502 and conductors 501 form the grid or screen. Linking connectors 540 may be provided as shown to connect successive conductors 501 so as to allow or restrict flexing of the screen or array.

Figure 37:
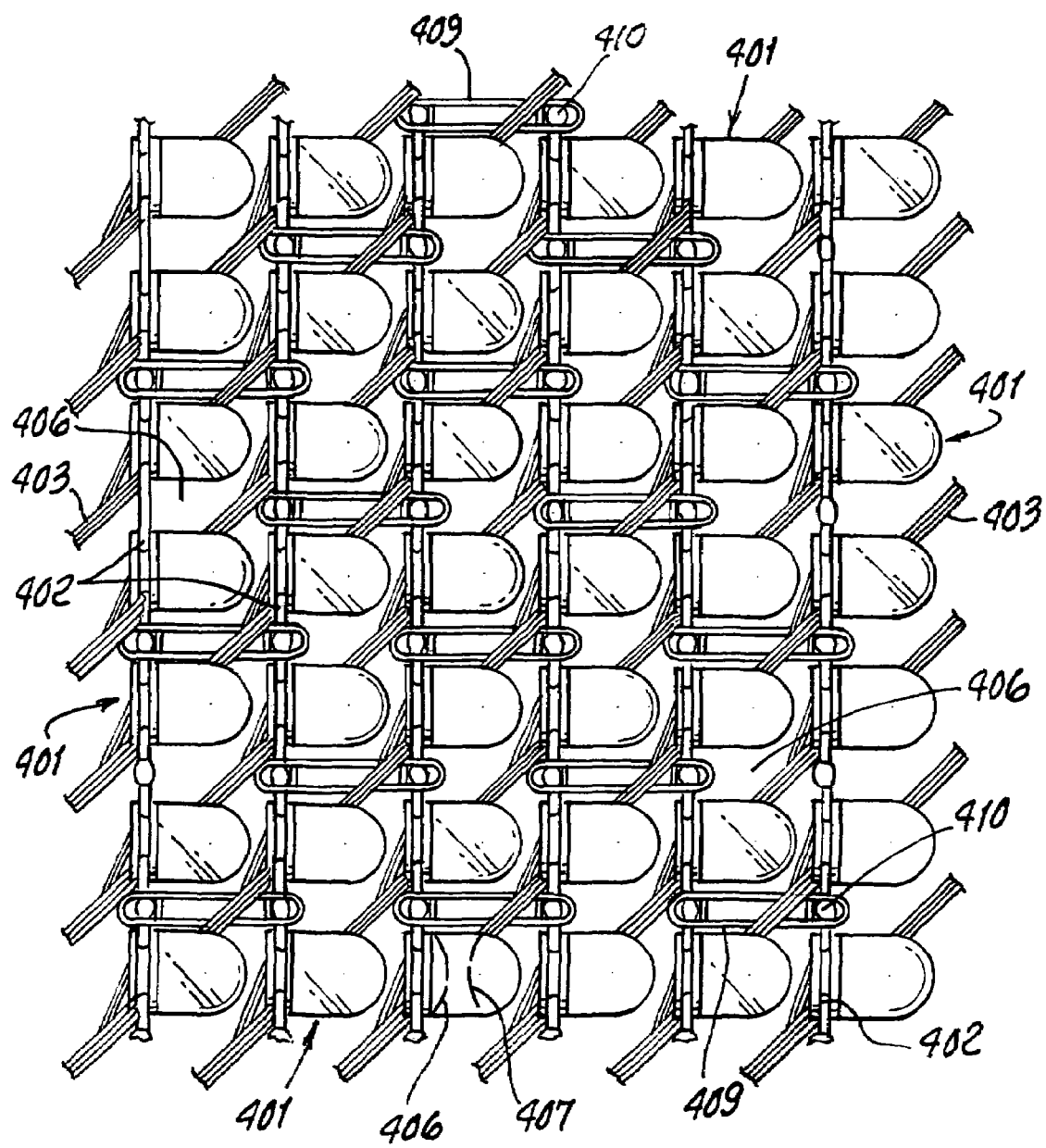
FIG. 37 is a plan view showing multiple light emitter packages supported by wires, in an array.
Figure 38:
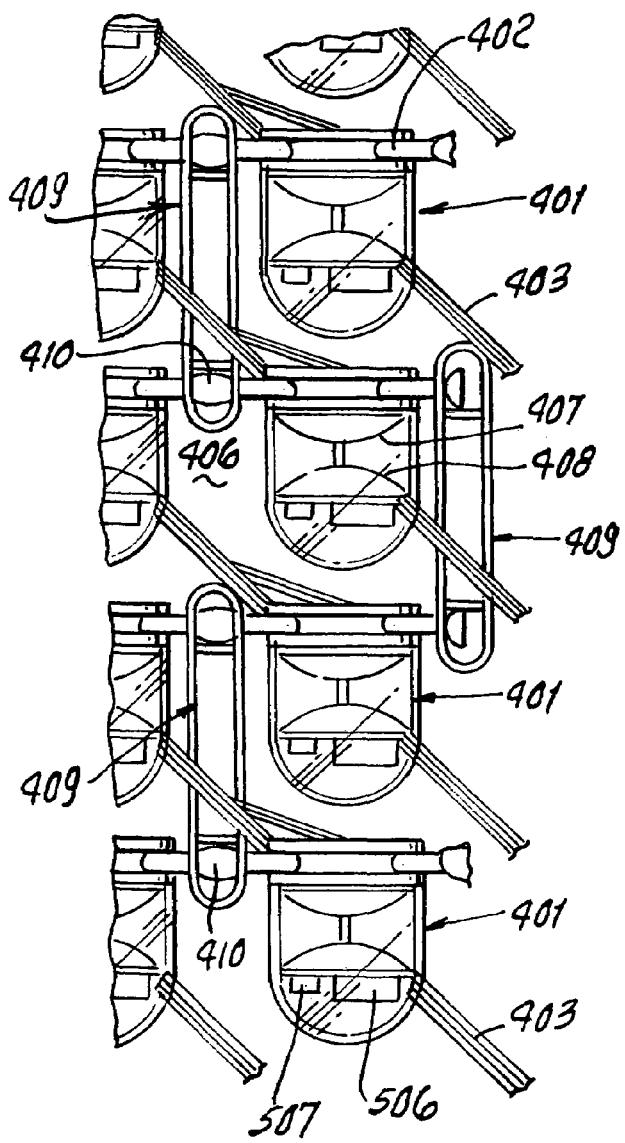
FIG. 38 is an enlarged view of a portion of the FIG. 37 array.
Figure 39:
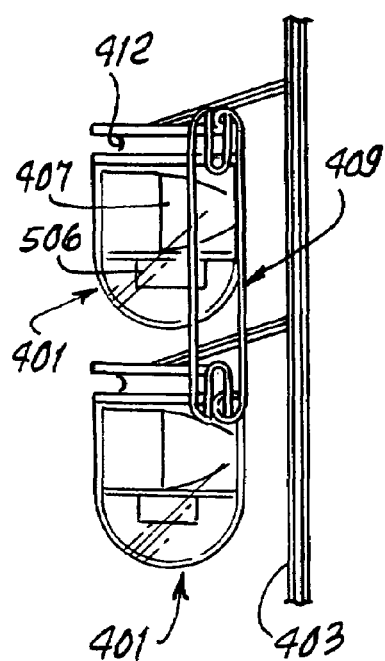
FIG. 39 is a view of two light emitter packages in FIG. 38, but in rotated positions.
Figure 40:
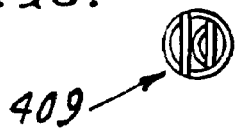
FIG. 40 is an end view of a connector as shown in FIGS. 38 and 39.
Figure 41:
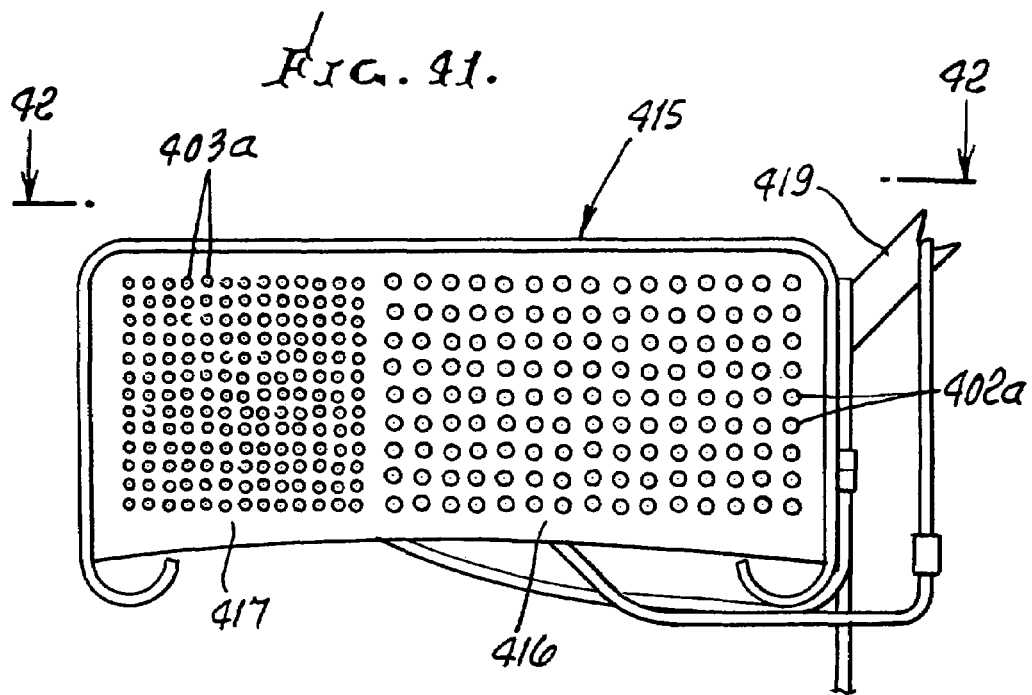
FIG. 41 is an end view of a conductor conduit supporting conductor wire terminal holders.

FIGS. 37–39 show rows and columns of light emitting packages (LEDs) 401 generally of the type referred to above, and supported by conductor wires 402 running vertically, in the drawing. Addressing (control) wires appear at 403, and run at acute angles, as for example 45°, relative to wires 402. Wires 402 and 403 form a grid, with coolant fluid passing passages 406 through the structure. The packages 401 contain internal mirrors 407 and 408 convex toward one another to reflect LED emitted light. Clips 409 are connected to bulges 410 on wires 402, to retain the wires in spaced relation as shown, and to block wire 402 rotation about their axes. FIG. 41 is an end view of a clip. The LED packages are electrically connected to wire 402 (that extend through grooves 412 in the bases of the LEDs), and to wires 403, via leads 413. See also circuitry 506 and 507, as described above.

Figure 42:
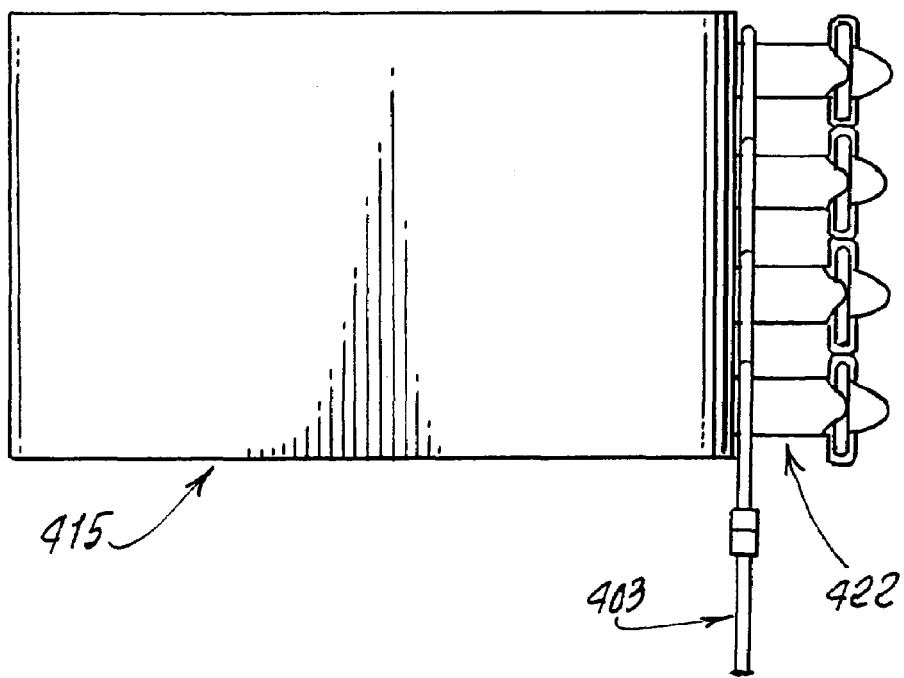
FIG. 42 is a top plan view taken on lines 42—42 of FIG. 41.
Figure 43:
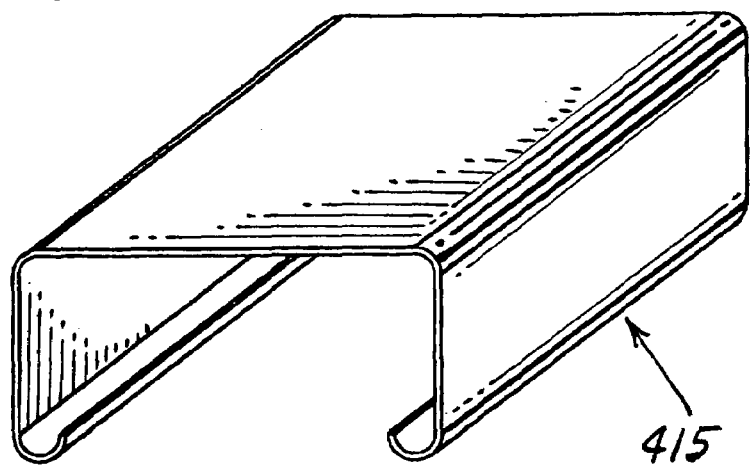
FIG. 43 is a perspective view of a conductor wire channel, as also seen in FIG. 41.
Figure 53:
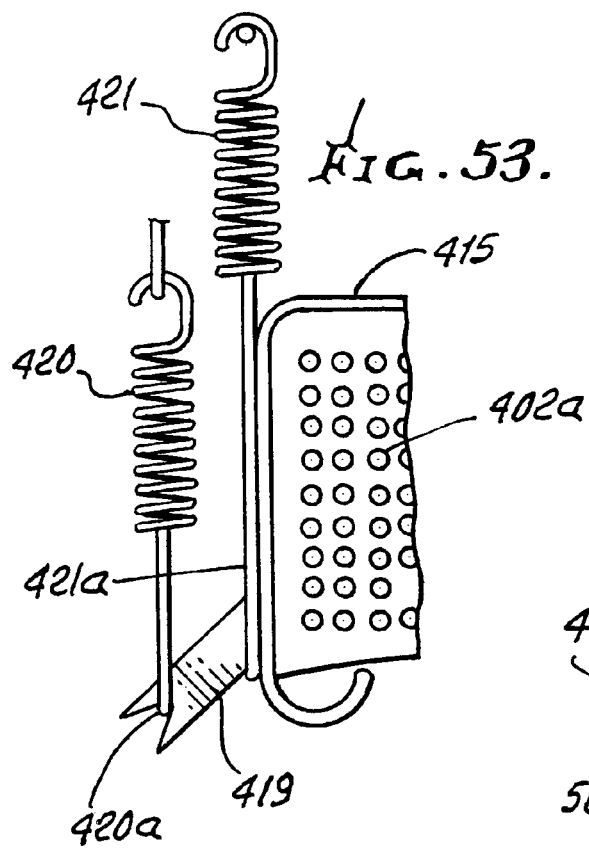
FIG. 53 is a fragmentary view showing conduit wire tensioning.

FIGS. 41–43 show a wire conduit 415, in the form of a metallic channel, for example. It supports or contains closely spaced conductor wires 402a in zone 416, and closely spaced addressing wires 403a, in zone 417, outside the display or grid, or at the edges of the grid. The items 402a and 403a shown in FIG. 41 represent wire cross sections, or wire passing openings in a plastic sheet, or plate, or support 417, carried by the conduit. Numeral 419 may represent a conduit support. See also FIG. 53 showing stabilizing tension springs 420 and 421 connected at 420a and 421a to support 419.

FIG. 42, an isometric view, also shows studs 422 forming wire terminals carried by conduit 415.

Figure 44:
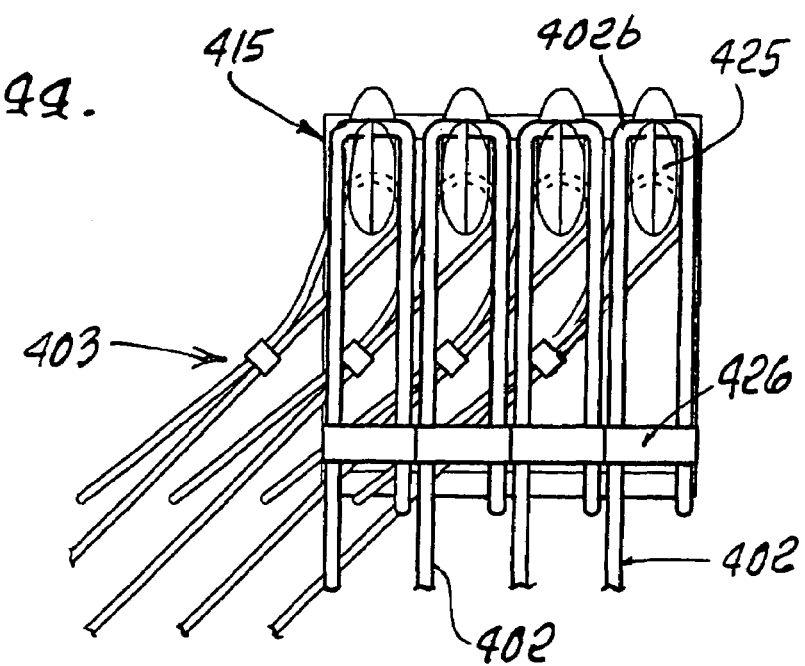
FIG. 44 is a view showing retraction of conductor wires.
Figure 96:
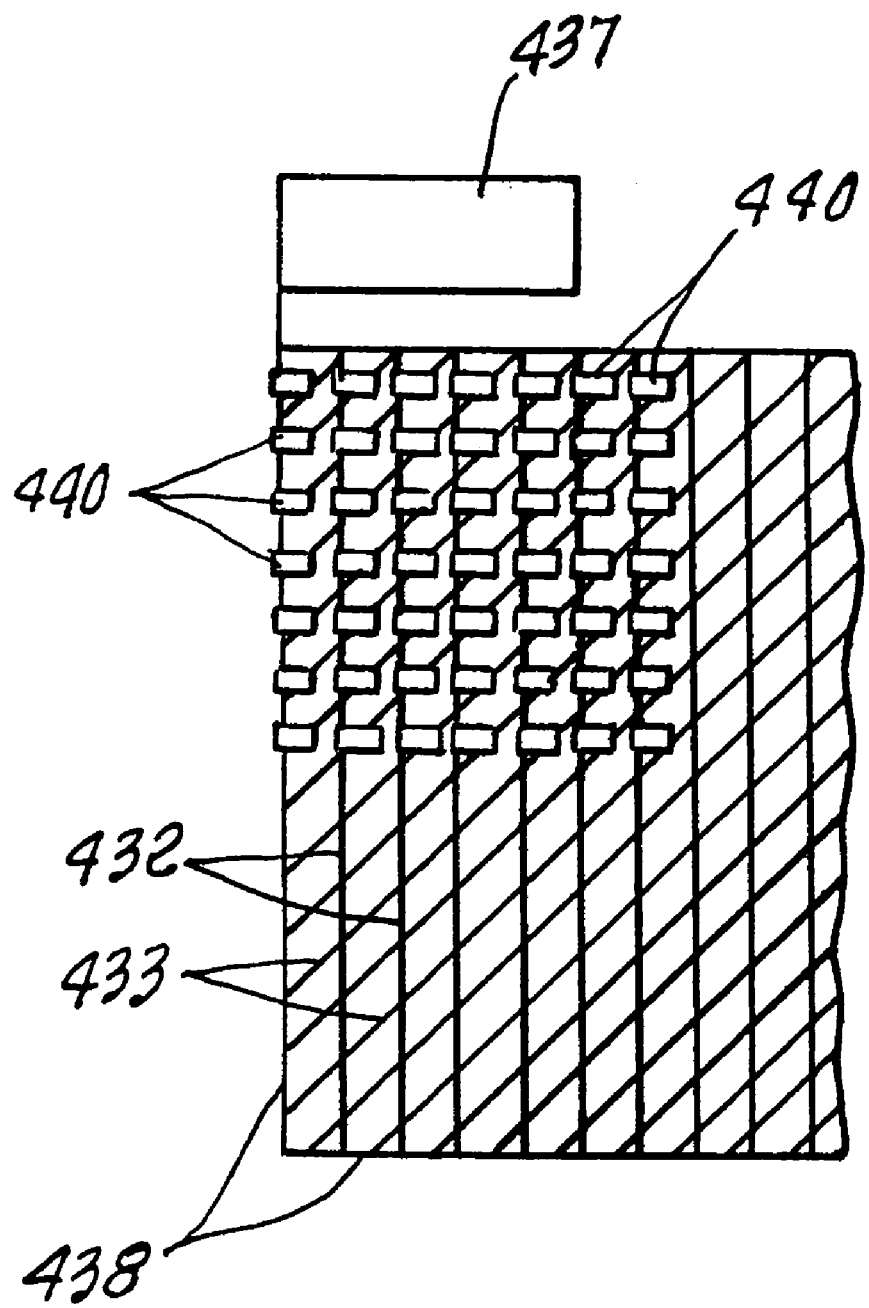

FIGS. 44 and 47 show conductor wires 402 having bends 402b and receiving bosses or retainers 425. See also address wires 403 that loop at 403a about retainers 425. A holder 426 extends crosswise of 402 to hold them in position. FIG. 45, like FIG. 42, also shows wire bends 402b looping about retainers 425. Retainers 422 also anchor the addressing wires 403, having connections 403a.

FIG. 46 schematically shows parallel conductor wires 432 extending vertically, and addressing wires 433 extending at 45° angles relative to wires 432, thereby forming a grid. LEDs i.e. pixel packages 440 are carried by the grid, as described above, and electrically connected to the wires 432 and 433. Electronic controls to control the LEDs are indicated at 437. A frame for the grid is shown at 438.

Figure 48:
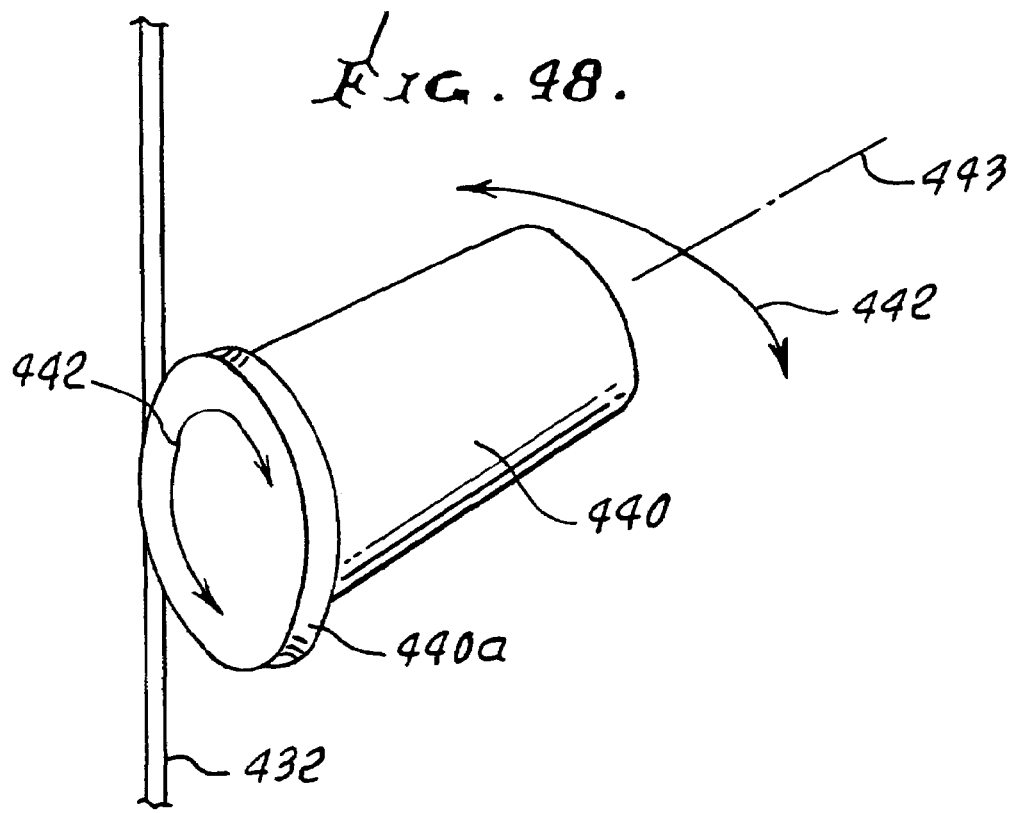
FIG. 48 is a schematic perspective view showing pixel package adjustment rotation about the package axes.
Figure 49:
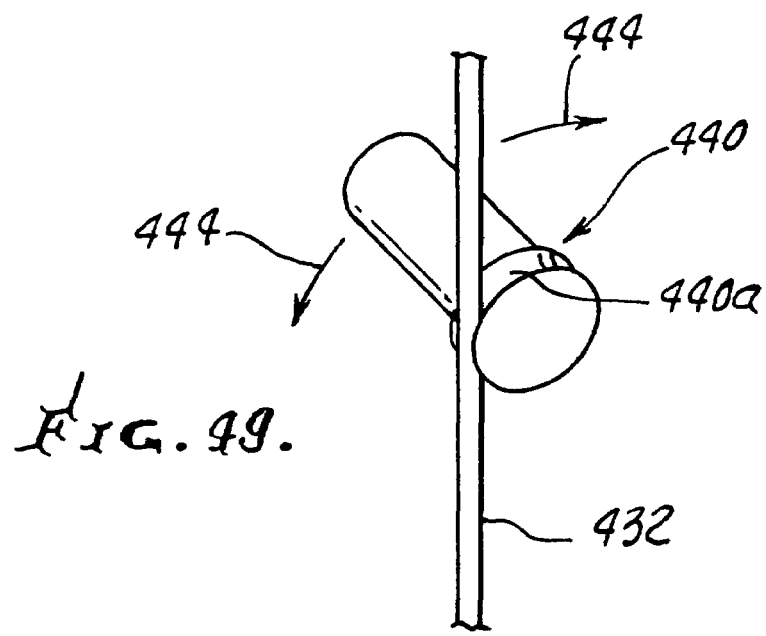
FIG. 49 is a schematic perspective view showing pixel package with adjustment rotation capacity about the axis of the package supporting conductor.
Figure 50:
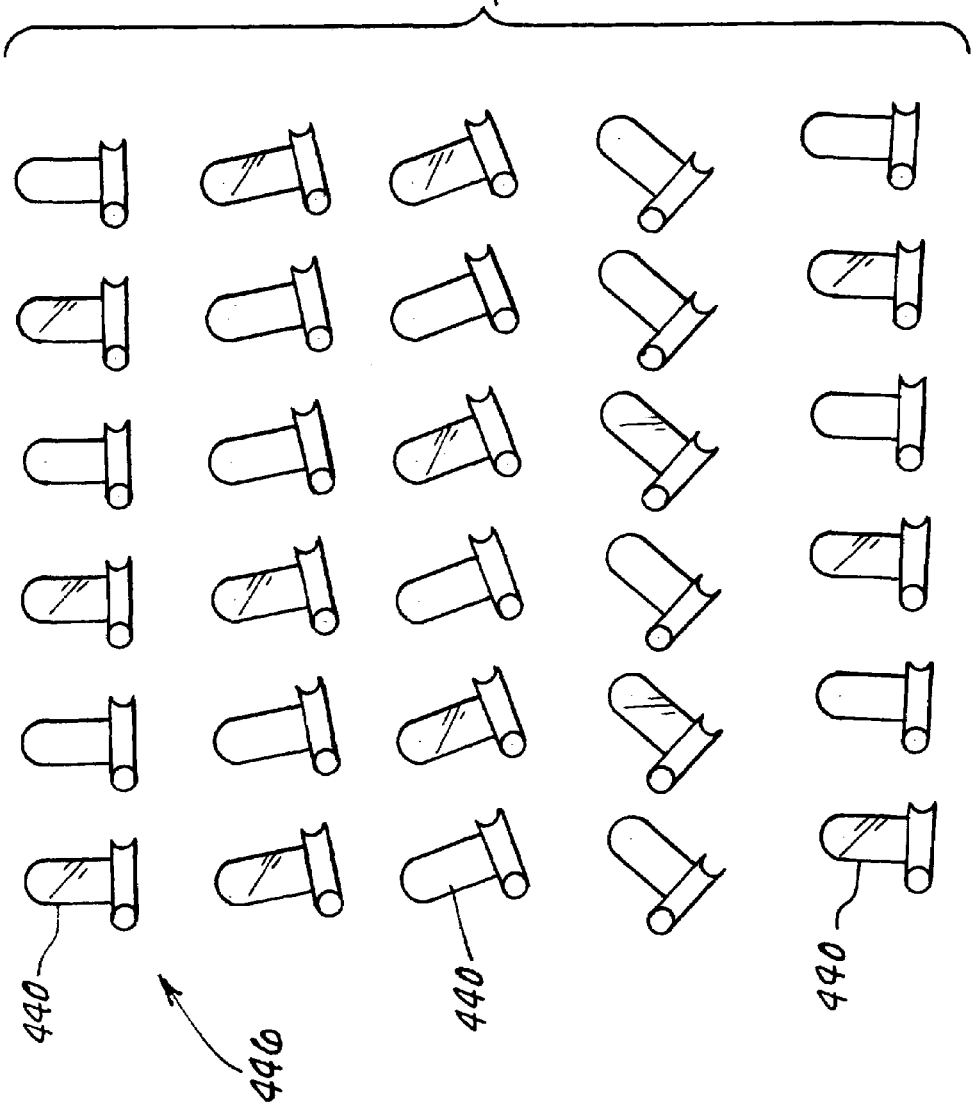
FIG. 50 shows in schematic form a representative grid having supporting wires or conductors, and pixel packages adjusted at different angles, as for use in a billboard.

FIG. 48 schematically shows a pixel package 440 peripherally attached to a conductor wire 432, as via an annular groove 440a in 440, allowing adjustable rotation of 440 (see arrows 442) about the package axis 443. FIG. 49 shows adjustable rotation of the package 440 about the lengthwise axis of conductor 432. See arrows 444. FIG. 50 schematically shows an array 446 of LED packages 440, with the packages in different rows having different adjusted angularities, for variably directing emitted light in selected directions.

Figure 51:
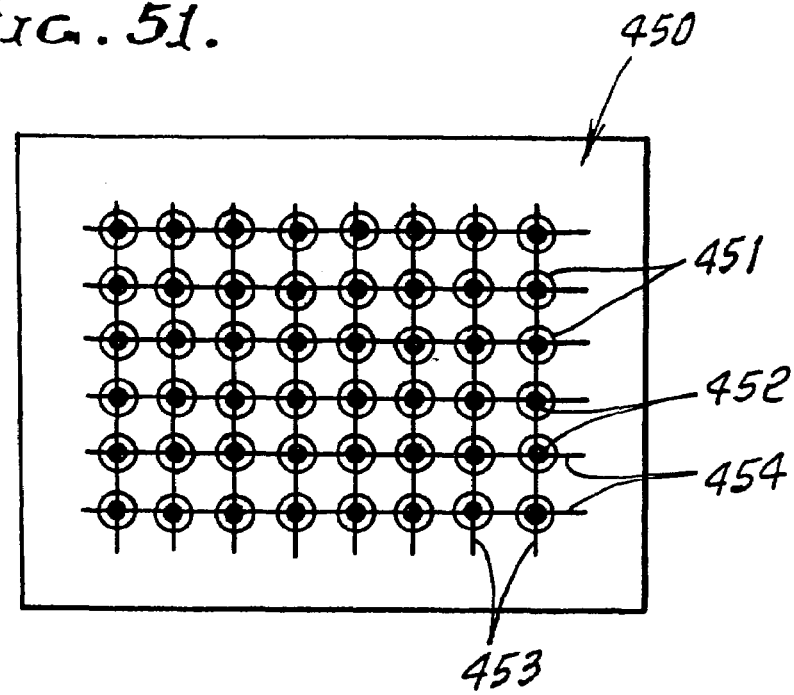
FIG. 51 is a schematic view showing pixel packages on a grid, and with control electronic circuitry integrated into the packages.
Figure 52:
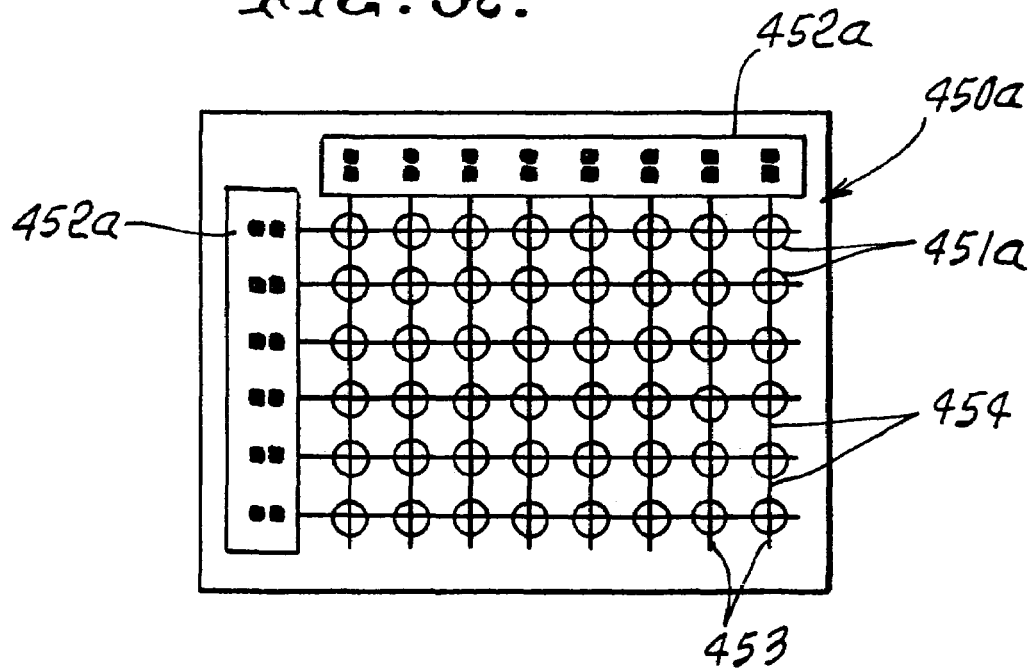
FIG. 52 is a schematic view like FIG. 51, with control circuitry in zones or modules at edges of the grid.

FIG. 51 schematically shows an array 450 of pixel packages 451, which have electronic control circuitry 452 within the pixel envelopes. In FIG. 52, the modified array 450a of LED pixel packages 451a has control circuitry 452a at edges of the array. Array wires 453 and 454 form grids.

Figure 54:
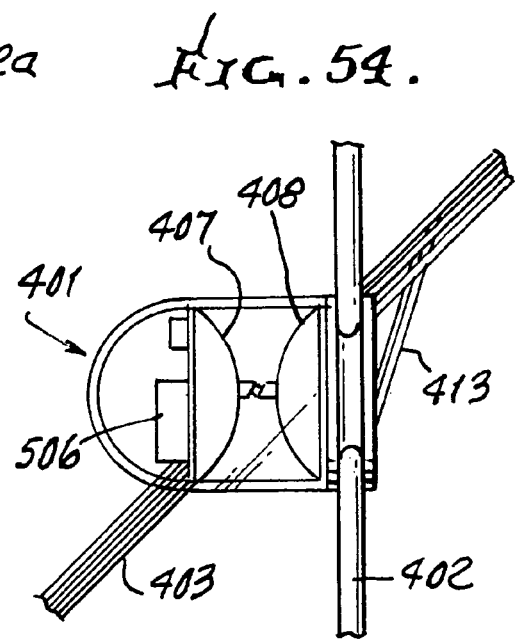
FIG. 54 is a schematic view showing use of bowed end wall mirrors in a pixel package.
Figure 55:
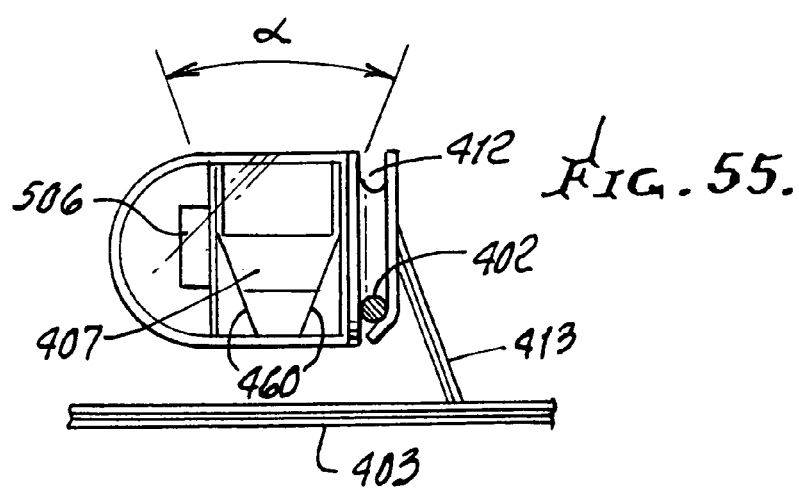
FIG. 55 is a view like FIG. 54, but rotated 90° about the package axis.

FIGS. 54 and 55 show LED pixel package elements the same as in FIGS. 39 and 39. Emitted radiation is within included angle α, in FIG. 5. Azimuth or radiation is reduced by vertical axis parabolic mirror trough, indicated at 460.

A preferred form of the invention appears in FIGS. 25–33 and FIGS. 37–39.

As disclosed herein, large-screen modular displays and signs are enabled, along with various curvatures and complex geometric forms. Also, large scale video displays, and projection displays as for billboards are made possible. Low volume, low mass, low cost, high brightness, high resolution and high efficiency are enabled. Double sided displays can be provided. LEDs can be placed on opposite sides of the screen, and the screen can serve as a pattern for LED placement.

LED bases can be placed on a transparent substrate, or the screen can be provided as a polymer film or sheet.

Screen and superstrate may collectively provide mechanical, structural strength. Superstrate may be thin or layered to allow second or third flexure modes. Superstrates may be thin to reduce sideways transmission of radiation from LEDs. Some LED sideways light transmission can be provided for integrating between pixels.

Provision is made for use of means to use conductive/red LEDs. Screen elements can be connected to side faces of LEDs via conductive adhesives, solder, amalgams, indium, stabilite22, and conductive grease. A metallic superstrate can be used.

Red LEDs can be provided with two conductors on same side (UEC red on sapphire)

Superstrates may have high refractive indices to increase usable radiation (polycarbonate 1.59)

Superstrates may have transparent adhesive layer, thermoplastic, thermoset, and/or pressure sensitive features.

The screen can be deformed after weaving, during manufacture, or deform screen before and/or during weaving. Screen warp and woof wires of different metals can be used to reduce the possibility of electrical shorting.

Another modification comprises an array of light emitting diodes periodically placed on the weft wires of a woven aluminum and/or copper screen (wire cloth) with the weft wires acting as one conductor, and the warp wires acting as the opposite conductor. The wires may be electrically isolated at their crossing points by such means as anodic coatings and/or by the addition of inorganic or organic over-coatings. The LEDs can be activated by pulsed and/or continuous current and may be addressed as a whole or in groups or individually as in an active video display by control of conductor energization. Woven wire screen provides a very low cost substrate.

Additional benefits include efficient heat transport, low mass, low volume, reel to reel manufacturing with screen travel between reels and roll-up on a reel with LEDs placed in position. This allows freedom of display shape, transportable in a roll, ability to be held in tension, in a wide range of materials and sizes.

A video display may include an X-Y grid of light emitting diodes placed on an aluminum woven screen suspended or placed between a transparent polycarbonate sheet and another enclosing sheet on the opposite side. An aluminum sheet with gaps between the screen and the enclosing sheet become sufficient to allow forced air to enter and flow upward between the polycarbonate sheet and the screen, through the screen and exiting at the top rearmost part of the screen.

Conductor wires act as structural conductors, electrical conductors, and thermal conductors, and may also be provided with a black region made especially effective because of "cavity effect". Wires may vary in size, materials, coatings etc. with axis, e.g. stainless steel wire may be used in tension in one axis direction and copper or aluminum wire of smaller diameter may be used in opposite axis direction (i.e. X-Y axes).

Manufacture may include placement of a screen on PTFE coated needle/cone array/drum to allow coating of die/wire bond/adhesive attach/screen without clogging holes; then forcing fluid through the screen to prevent clogging. Screens can be spaced apart by use of beads or spheres.

Electrostatic or electromagnetic powering of LEDs is possible, and particularly pulsed operation, as with LED video displays. High applied voltage allows smaller conductor cross sections.

LEDs with junction faces on metal, or with good junction heat transfer/thermal capacitance, can withstand very high voltage spikes.

Patterned superstrate and/or substrate may act as one conductor and screen or substrate as another conductor.

Anisotropic screens may be provided with wires along one axis of a different material than wires extending along another axis (thickness, form, alloy. Tensile strength and flexibility may be more important in one axis e.g. opposite roll axis or row axis; dissimilar metals are more apt to form dielectric regions at points of contact and this may be encouraged via processing and/or choice of material properties and coatings; a current flow in one LED row may be several times greater than current flow in another LED row.

Advantages and benefits of the FIGS. 25 to 28 described LED device construction include:

SPATIAL TUNING: Benefits accruing from the ability to aim the radiation from the emitters to the target include a reduction in emitter cost and/or electrical system cost and/or operating cost and/or increased radiation delivered to the target. The herein described pixel package can be rotated as for example 360 degrees around it's axis and 360 degrees around an axis perpendicular to its'axis, and as a consequence has complete freedom of movement in both elevation and azimuth.

HORIZONTAL AXIS OPTICS: The target audience for signage and billboards typically moves horizontally as in vehicles. Horizontal axis optics provide for optimum control as the horizontal angular aperture is typically much greater than the vertical angular aperture.

ANGULAR APERTURE CONTROL: Minimizing the radiation beyond the angular extent needed for the task is an important element in minimizing cost. Maximizing the aperture to emitter size ratio allows a minimization of the angular extent of the output radiation. The herein described pixel design allows for a minimization of the output radiation by minimizing the emitter array size via close emitter spacing and a narrow gauge substrate and by maximizing the aperture size for a given pixel spacing.

BIFACIAL DISPLAY: Bifacial displays are possible with a single array of bifacial pixels or via a forward and rearward spaced pixel arrays, which may provide or allow differing energizing content to the displays. The pixel package allows mounting in front of or in back of the display "plane". This allows one face to use pixel packages mounted on the front of the vertical wires and facing forward, and the opposite face to use pixel packages mounted on the opposite side of the wires and facing rearward. The packages may be displaced vertically to allow clearance.

TRANSPARENT DISPLAY: OnScreen displays can be made with a wide range of transparency to suit a variety of end uses.

OPTICAL EFFICIENCY: The pixel design allows for use of a linear emitter array coupled with a visible mirror film parabolic trough, to control radiation in the vertical axis. Horizontal axis radiation may be controlled by end reflectors of similar material and these may be curved to aid in the control of the angular extent of the radiation in the horizontal axis. This design minimizes the average number of reflections and provides for high efficiency for each reflection. The pixel optical system may be contained within a cylindrical glass envelope for environmental protection. Additional benefits of such an envelope include:

1) functioning as a circular compressive element to constrain the elastically deformed 3M VMF and thereby cause it to form a parabolic curve; (The film is typically specularly reflecting film such as 3M visible mirror film. The reflecting film may be paired with/attached to additional film/s to provide the desired mechanical and other properties. The film/s may also be adhered to the container walls and/or constrained by lands/ridges/bumps along the container walls.)

2) functioning as a container for a wide range of liquids, gels, solids, and/or smaller containers;

3) functioning as a refractive optical element.

CONTRAST RATIO: Increasing the contrast ratio allows an improvement in visibility and/or a reduction in radiative power for a given visibility. The herein described OnScreen configuration allows high contrast ratio viewing by:

1) Minimizing the angular extent of the output radiation and increasing the aperture area of the output radiation reduces the probability of sunlight or other extraneous radiation being reflected from the OnScreen "display" to the target/viewer, 2) Optical porosity (low solidity), which allows a portion of the radiation that would impinge on and possibly be reflected into the target on a high solidity display pass through and be absorbed on a subsidiary surface/s, 3) Insuring all surfaces within the targets field of view have very low reflectivity by means such as coating and texturing.

DETECTOR/DETECTOR ARRAY: OnScreen and/or the described pixel may also operate as detectors, alone or in conjunction with emitters.

Thermal

The lifetime and efficiency of semiconductor devices (LEDs) degrades strongly with increasing temperature. Provision is made for reducing the thermal resistance between the emitters and the local environment, and thereby increasing lifetime, reliability, durability, and efficiency and reduce operating cost, pursuant to provision of the following:

1) A low solidity array which allows a portion of the solar load to be diverted to subsidiary surfaces and thereby make a smaller contribution to array heating. In addition, the open design allows airflow in and around the array and in very close thermal communication with the emitters.

2) Wind enhanced cooling. A porous array allows the passage of and the ability to transfer heat to the local air stream. Wind speed increases strongly with increasing height and high mounted signage and displays may benefit greatly from this cooling.

3) Thermally induced convection cooling caused by the wire array, the pixel packages, and by proper design of subsidiary surfaces behind the array (horizontal axis overlapping slats/louvers).

4) Solar assisted cooling may be promoted by proper design of subsidiary louvered absorber array behind the screen. Louver surfaces with a high absorptivity for sunlight and a low infrared emissivity may be used to further increase airflow.

5) The OnScreen pixel package enables use of a rectangular copper substrate for LED mounting. This substrate acts as a thermal, electrical, and structural conduit and its cross section may be easily sized to provide sufficiently low thermal resistance. The pixel package is thermally coupled to the row and column wires to aid in the transport of heat to the local environment. In addition, the pixel package may be liquid filled to allow reduced LED operating temperature.

6) Active cooling may be used if necessary, but its need and its cost may be greatly reduced by the aforementioned features.

Provision is made for use of active and/or passively addressed pixels. Local (pixel based) electronics may be included in the pixel package and placed on the emitter substrate, behind the reflector, in the aluminum bushing and/or in the hemispherical cap. Local electronics may vary with application and include capacitors, resistors, inductors, diodes, transistors, standard integrated circuits such as 555 timers or application specific integrated circuits. Multiplexing may be used to reduce the cost of the electrical system, and the ability to multiplex is greatly increased by minimizing the pixel output radiation required by means discussed in the above optics section.

Provision is made for for use of in-field replaceable pixels that may be made to be replaceable from either side of the screen.

Use of vertically oriented column/common wires and 45 degree oriented row/addressing wires allows large scale seamless signage and displays with all pixels/electronics addressable/accessible from the top or the bottom of the screen.

Control electronics may be integrated into pixel packages; and/or control electronics may be concentrated in modules or zones at edge or edges of the arrays.

Provision is made for use of robust signage/displays created by arranging a parallel array of large diameter vertically oriented common/column wires in tension between horizontal upper and lower rigid members. The upper end of each vertical wire may be formed into a loop and affixed to and electrically isolated from the upper rigid horizontal member. The lower end of each vertical wire may be formed into a loop and elastically attached to and electrically isolated from the lower rigid member by a stainless steel extension spring. Both upper and lower mounts may serve to prevent rotation of the vertical wires around their own axes. A parallel array of 45 degree row wires may be connected in tension between the upper and lower rigid horizontal members by means analogous to those described for the vertical wire array. The 45 degree row wires may be constructed of a large diameter electrically insulated central wire helically wound with a 6 strand small diameter multifilar insulated wire array. The multifilar wire array includes paired red, green, and blue wires. The 45 degree wire array may be placed behind the vertical wire array and the pixel packages may be mounted in front of the vertical wires. The pixel packages may be mechanically connected to the vertical wires by plastic deformation of the pixel package aluminum bushing and/or the wire and/or by adhesives. The pixel common wire may be electrically connected to the large diameter vertical common wire through the aluminum bushing via wirebonding or pressure welding or directly to the larger diameter wire by soldering or pressure type connection. Red, green, and blue wires emanating from the pixel may be connected to the 45 degree row wires by soldering or by pressure type contacts.

The row and column wires may be constructed of aluminum to reduce cost and weight for a given strength, electrical and thermal conduction. In addition, electrically insulative coatings adhere better and have longer life on aluminum than copper.

Signage and displays of simple or complex face or form (circular or hyperbolic cylinders, cones and conoids, hyperbolic paraboloids) may be assembled on site or shop fabricated by simple techniques that lend themselves to manual or automated fabrication.

Other important advantages of the invention are listed as follows:

1. Organic Light Emitting Diodes: (OLEDS) may be used as light emitters alone or in conjunction with inorganic LEDs. OLEDs may be easier to apply to screen type substrates and may allow reduced product cost.

2. Multiplexinq: The ability to tailor the angular extent of the radiation output and the increased contrast provided by the OnScreen design allows a greater degree of multiplexing and a concurrent reduction in system cost.

3. Scanninq: 45° scanning reduces line artifacts compared to vertical or horizontal scanning and thereby allows higher apparent resolution for a given number of pixels and/or a reduced number of pixels for a given apparent resolution.

4. In Field Pixel Replaceability: The ability to replace individual pixels in the field allows reduced maintenance cost.

5. Freedom of Form: Array construction allows a wide variety of signage/display forms. One example is a vertical axis cylindrical display viewed from the inside and/or the outside and with varying degree of array transparency determined by design.

6. Shop Or Site Fabrication: The light weight and flexible nature of the OnScreen array coupled with the mechanism of flexible local linkage allows for shop fabrication of large area arrays.

7. Pixel Level Voltage Reduction: Pixel "on-board" reduction allows higher array supply voltages and thereby lower current levels and reduced self-heating of array wiring and/or reduced wire cross-sectional area.

I claim:

1. An LED array assembly, comprising in combination:
   a) a woven grid of electrical conductors,
   b) light emitting diodes in association with the grid and in electrical communication with the conductors that provide power for LED operation,
   c) the grid operable to receive heat from the diodes during diode operation, and the grid defining interstices between the conductors, open in directions through the grid, sized and distributed over the grid to enable viewing through the grid, for passing coolant fluid into close heat transfer relation with the grid and diodes, for transfer of heat to the fluid from the grid and from the diodes.

2. The combination of claim 1 wherein the electrical conductors comprise insulated metal wires that act as electrical and thermal conductors and that also serve as structural load conductors, for arrays of such diodes.

3. An LED array assembly, comprising in combination:
a) a grid of electrical conductors,
b) light emitting diodes in association with the grid and in electrical communication with the conductors that provide power for LED operation,
c) the grid operable to receive heat from the diodes during diode operation, and the grid configured for passing coolant fluid for transfer of heat to the fluid,
d) and wherein said electrical conductors comprise insulated metal wires that act as electrical and thermal conductors and that also serve as structural load conductors, for arrays of such diodes,
e) wherein the wires have dielectric coatings thereon.

4. The combination of claim 1 wherein the conductors comprise woven wires.

5. The combination of claim 1 wherein the array has at least one of the following:
i) curvature
ii) complex shape
iii) compliant configuration
iv) flexibility.

6. The combination of claim 1 including means to effect and/or guide flow of coolant fluid through or along the array.

7. The combination of claim 1 wherein the grid is dark to increase viewing contrast with LEDs during their operation.

8. The combination of claim 1 including one of the following:
i) a substrate above which LEDs are placed
ii) a superstrate associated with the array and LEDs to provide structural strength to the assembly.

9. The combination of claim 1 including a first sheet at one side of the grid and diodes and facing the diodes, to pass light emitted by the diodes.

10. An LED array assembly, comprising in combination:
a) a grid of electrical conductors,
b) light emitting diodes in association with the grid and in electrical communication with the conductors that provide power for LED operation,
c) the grid operable to receive heat from the diodes during diode operation, and the grid configured for passing coolant fluid for transfer of heat to the fluid,
d) there being a first sheet at one side of the grid and diodes and facing the diodes, to pass light emitted by the diodes,
e) and including a second sheet at the opposite side of the grid and diodes, the first and second sheets forming an enclosure within which coolant fluid is flowable.

11. The combination of claim 1 wherein the electrical conductors include primary conductors extending generally in one direction, and secondary conductors extending generally in another direction, the LEDs mounted on the primary conductors, and having terminals extending to the secondary conductors for electrical association thereto.

12. The combination of claim 11 wherein the secondary conductors are configured to extend above and/or below the primary conductors.

13. The combination of claim 12 wherein the secondary conductors are characterized by one of the following:
i) substantial spacing therebetween to pass coolant fluid through the grid,
ii) lack of substantial spacing therebetween, to pass coolant fluid parallel to the grid,
iii) cross sections which are substantially less than the cross sections of primary conductors which support diodes,
iv) junctions with diode wires.

14. The combination of claim 1 wherein certain of the conductors include multiple wire strands.

15. The combination of claim 1 including balls or beads seated on the conductors to act as spacers.

16. The combination of claim 1 including means for displacing and conducting coolant to one side of the grid, to flow through or adjacent to the grid.

17. The combination of claim 1 wherein the LEDs product light having light paths, and including a transparent panel extending in said paths of light from the LEDs.

18. The combination of claim 1 wherein each diode includes a light emitter or emitters, a transparent container having a window area, the emitter supported within the container, and a reflector within the container to reflect emitted light toward said window.

19. The combination of claim 18 including an electrical lead or leads extending with helical configuration within the container to said emitter or emitters.

20. The combination of claim 19 wherein the lead or leads has or have a generally rectangular cross section, and support the emitter or emitters.

21. An LED array assembly, comprising in combination:
a) a grid of electrical conductors,
b) light emitting devices in association with the grid and in electrical communication with the conductors that provide power for LED operation,
c) the grid operable to receive heat from the devices during device operation, and the grid configured for passing coolant fluid for transfer of heat to the fluid,
d) each device including a light emitter or emitters, a transparent container having a window area, the emitter supported within the container, and a reflector within the container to reflect emitted light toward said window,
e) there being an electrical lead or leads extending with helical configuration within the container to said emitter or emitters,
f) and including a metallic base carrying the container, and through which said lead or leads extend.

22. The combination of claim 20 wherein said lead or leads include wires associated with a red and/or green and/or blue emitter.

23. The combination of claim 18 wherein multiple of said diodes have their container windows facing in the same or selected directions.

24. An LED array assembly, comprising in combination:
a) a grid of electrical conductors,
b) light emitting diodes in association with the grid and in electrical communication with the conductors that provide power for LED operation,
c) the grid operable to receive heat from the diodes during diode operation, and the grid configured for passing coolant fluid for transfer of heat to the fluid,
d) each diode including a light emitter or emitters, a transparent container having a window area, the emitter supported within the container, and a reflector within the container to reflect emitted light toward said window,
e) and wherein multiple of said diodes have their container windows facing in the same or selected directions,
f) and wherein the diodes and grid define a display.

25. The combination of claim 21 wherein said base has an edge portion defining a recess for reception of a support for the diode, allowing diode rotation relative to the support.

26. The combination of claim 25 wherein electrical conductors define a mesh, and multiple of said LED devices carried by the mesh, with said recesses receiving support portions of said conductors allowing rotation of the devices relative to the mesh.

27. The combination of claim 3 wherein each light emitting diode comprises, in combination
   i) an electrically energizable light emitter, or emitters;
   ii) a transparent container having a window;
   iii) the emitter or emitters supported within the container;
   iv) and a reflector structure within the container to reflect emitted light toward said window.

28. The combination of claim 26 including an electrical lead or leads extending with helical configuration within the container to said emitter or emitters.

29. The combination of claim 27 wherein the lead or leads has or have a generally rectangular cross section, and support the emitter or emitters.

30. The combination of claim 26 including a metallic base carrying the container, and through which said lead or leads extend.

31. The combination of claim 26 wherein said reflector structure includes spaced reflecting walls, and a curved reflector supported between said walls.

32. The combination of claim 28 wherein said lead or leads include wires associated with a red and/or green and/or blue emitter.

33. The combination of claim 26 wherein there are multiple of said devices having thin windows facing in a display direction or directions.

34. The combination of claim 33 including display structure supporting said diodes in a multiple diode display configuration.

35. The combination of claim 30 wherein said base has an edge portion defining a recess for reception of a support for the diode, allowing diode rotation about the support.

36. The combination of claim 1 wherein certain of said conductors that provide power for diode operation comprise first, second and third pairs of wires to transmit electrical energization to red, green and blue LED pixels, respectively.

37. An LED array assembly, comprising in combination:
   a) a grid of electrical conductors,
   b) light emitting diodes in association with the grid and in electrical communication with the conductors that provide power for LED operation,
   c) the grid operable to receive heat from the diodes during diode operation, and the grid configured for passing coolant fluid for transfer of heat to the fluid,
   d) and wherein certain of said conductors that provide power for diode operation comprise first, second and third pairs of wires to transmit electrical energization to red, green and blue LED pixels, respectively,
   e) and wherein each LED has primary, secondary and tertiary wires electrically connected to the red, green and blue pixels, respectively, said primary wire being clamp connected to said first pair of wires, said secondary wire being clamp connected to said second pair of wires, and said tertiary wire being clamp connected to said third pair of wires.

38. The combination of claim 37 wherein said three pairs of wires are disposed about a central region, and said primary, secondary and tertiary wires are respectively nested between said three pairs of wires, there being a retainer acting to clamp said primary, secondary and tertiary wires in nested position.

39. The combination of claim 38 wherein said certain conductors extend at an acute angle or angles relative to others of said conductors, said certain conductors defining LED addressing conductors to selectively address LEDs on said others of the conductors.

40. The combination of claim 39 wherein said acute angle or angles are approximately 45°.

41. The combination of claim 1 including protective means at one of the following:
   i) at the front of the grid;
   ii) at the rear of the grid;
   iii) at both the front and rear of the grid.

42. An LED array assembly, comprising in combination:
   a) a grid of electrical conductors,
   b) light emitting diodes in association with the grid and in electrical communication with the conductors that provide power for LED operation,
   c) the grid operable to receive heat from the diodes during diode operation, and the grid configure for passing coolant fluid for transfer of heat to the fluid,
   d) there being protective means at one of the following:
      i) at the front of the grid;
      ii) at the rear of the grid;
      iii) at both the front and rear of the grid,
   e) and wherein said protective means includes at least one metallic plate.

43. The combination of claim 42 wherein said metallic plate is characterized by one of the following:
   $X_1$ forming air passing openings;
   $X_2$ forming air passing louvers;
   $X_3$ forming air passing through slits.

44. The combination of claim 42 wherein said protective means comprises a metallic screen or screens.

45. The combination of claim 1 wherein the diodes are removably supported by the grid.

46. The combination of claim 1 characterized by at least one of the following:
   i) diode emission control electronics within diode packages
   ii) diode emission control electronics at or proximate an edge or edges of the grid.

47. The combination of claim 1 including diode packages at said diodes, and a light reflecting mirror or mirrors within said diode packages.

48. The combination of claim 47 characterized by one or more of the following:
   i) a parabolic mirror
   ii) dual mirrors within a package
   iii) a parabolic trough forming mirror or mirrors.

49. The combination of claim 1 including a conduit for extensions of the conductors, outside the grid.

50. An LED array assembly, comprising in combination:
   a) a grid of electrical conductors,
   b) light emitting diodes in association with the grid and in electrical communication with the conductors that provide power for LED operation,
   c) the grid operable to receive heat from the diodes during diode operation, and the grid configured for passing coolant fluid for transfer of heat to the fluid,
   d) there being a conduit for extensions of conductors, outside the grid,
   e) and including spring tension exerting means acting on certain of the conductors.

51. An LED array assembly, comprising in combination:
   a) a grid of electrical conductors,
   b) light emitting diodes in association with the grid and in electrical communication with the conductors that provide power for LED operation, c) the grid operable to receive heat from the diodes during diode operation, and the grid configured for passing coolant fluid for transfer of heat to the fluid, d) there being a conduit for extension of conductors, outside the grid, e) and including holders about which end portions of the conductors in the grid are looped, the holders associated with the conduit.

52. The combination of claim 1 wherein the diodes comprise packages having adjustable operative connection to the conductors characterized by one of the following:
   i) rotatable adjustability about one axis
   ii) rotatable adjustability about two axes.

53. The combination of claim 52 wherein the diodes in the array have different positions of adjusted angularity.

54. An LED array assembly, comprising in combination:
   a) a grid of electrical conductors,
   b) light emitting diodes in association with the grid and in electrical communication with the conductors that provide power for LED operation,
   c) there being LED structure allowing rotary adjustment of at least some LEDs relative to conductors on which those LEDs are supported
   d) and clip means positioning the conductors relative to which the LEDs are rotatably adjustable.

55. The combination of claim 54 wherein said rotary adjustment is characterized by one of the following:
   i) about an axis or axes defined by the LED or LEDs
   ii) about a conductor axis or axes
   iii) about both i) and ii) above.

56. An LED array assembly, comprising in combination:
   a) a grid of electrical conductors,
   b) light emitting diodes in association with the grid and in electrical communication with the conductors that provide power for LED operation,
   c) the grid operable to receive heat from the diodes during diode operation, and the grid configured for passing coolant fluid for transfer of heat to the fluid,
   d) there being springs exerting tension on at least certain of the conductors, respectively, outside the grid.

57. An LED array assembly, comprising in combination:
   a) a grid of electrical conductors,
   b) light emitting diodes in association with the grid and in electrical communication with the conductors that provide power for LED operation,
   c) the grid operable to receive heat from the diodes during diode operation, and the grid configured for passing coolant fluid for transfer of heat to the fluid,
   d) said conductors including first conductors which are linearly straight, and second conductors which include undulations extending over and under the first conductors,
   e) the diodes mounted on the first conductors at locations between second conductor undulations that extend over alternate first conductors, there being electrical connectors extending from the diodes to exposed metallic surfaces formed by the undulations.

* * * * *